(12) United States Patent
Woo et al.

(10) Patent No.: US 12,482,937 B2
(45) Date of Patent: Nov. 25, 2025

(54) ELECTRONIC DEVICE HAVING ANTENNA

(71) Applicant: LG ELECTRONICS INC., Seoul (KR)

(72) Inventors: Seungmin Woo, Seoul (KR); Yusuhk Suh, Seoul (KR); Dongik Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 180 days.

(21) Appl. No.: 18/564,912

(22) PCT Filed: May 31, 2021

(86) PCT No.: PCT/KR2021/006756
§ 371 (c)(1),
(2) Date: Nov. 28, 2023

(87) PCT Pub. No.: WO2022/255503
PCT Pub. Date: Dec. 8, 2022

(65) Prior Publication Data
US 2024/0291149 A1    Aug. 29, 2024

(51) Int. Cl.
H01Q 5/335    (2015.01)
H01Q 9/40    (2006.01)
H01Q 21/06    (2006.01)
H05K 3/46    (2006.01)

(52) U.S. Cl.
CPC .............. *H01Q 5/335* (2015.01); *H01Q 9/40* (2013.01); *H01Q 21/06* (2013.01); *H05K 3/4623* (2013.01)

(58) Field of Classification Search
CPC .......... H01Q 5/335; H01Q 9/40; H01Q 21/06; H05K 3/4623
See application file for complete search history.

(56) References Cited

U.S. PATENT DOCUMENTS

| | | | |
|---|---|---|---|
| 2020/0328518 A1* | 10/2020 | Park | H01Q 21/065 |
| 2020/0328530 A1* | 10/2020 | Park | H01Q 1/2283 |
| 2020/0388924 A1* | 12/2020 | Lee | H01Q 9/045 |
| 2021/0151899 A1* | 5/2021 | Park | H01Q 5/385 |

(Continued)

FOREIGN PATENT DOCUMENTS

| | | |
|---|---|---|
| KR | 10-2012-0134254 | 12/2012 |
| KR | 10-2015-0032972 | 4/2015 |

(Continued)

OTHER PUBLICATIONS

PCT International Application No. PCT/KR2021/006756, International Search Report dated Feb. 25, 2022, 5 pages.

*Primary Examiner* — Hai V Tran
(74) *Attorney, Agent, or Firm* — LEE, HONG, DEGERMAN, KANG & WAIMEY

(57) ABSTRACT

Provided is an electronic device having an antenna. The electronic device comprises: a radiator configured by stacking metal patterns on different layers of a multi-layer structure; and an antenna module including a feeding unit disposed on a specific layer of the radiator and having a feeding line configured to be connected to the radiator, wherein the radiator includes a first pad connected to the feeding line and a second pad disposed on the first pad, and the first pad and the second pad are connected to each other by a first connection line and a second connection line.

4 Claims, 26 Drawing Sheets

(56) References Cited

U.S. PATENT DOCUMENTS

| | | | | |
|---|---|---|---|---|
| 2022/0247083 A1* | 8/2022 | Kim | ........................ | H01Q 21/24 |
| 2022/0368003 A1* | 11/2022 | Chiang | ................ | H01Q 9/0485 |
| 2023/0139460 A1* | 5/2023 | Woo | ........................ | H01Q 21/28 |
| | | | | 343/702 |

FOREIGN PATENT DOCUMENTS

| KR | 10-2019-0078548 | 7/2019 |
|---|---|---|
| KR | 10-2019-0080452 | 7/2019 |
| KR | 10-2020-0141339 | 12/2020 |

\* cited by examiner (a)

(b)

(a)

(b)

(a)

(b)

(a)

(b)

FRONT VIEW (a)

SIDE VIEW (b)

(a)

(b)

(a)

(b)

(a)

(b)

(a)

(b)

(c)

(a)

(b)

(c)

ELECTRONIC DEVICE HAVING ANTENNA

CROSS-REFERENCE TO RELATED APPLICATION

This application is the National Stage filing under 35 U.S.C. 371 of International Application No. PCT/KR2021/006756, filed on May 31, 2021, the contents of which are hereby incorporated by reference herein its entirety.

TECHNICAL FIELD

The present disclosure relates to an electronic device having antennas. One particular implementation relates to an antenna module realized in a multi-layered circuit board and an electronic device having the same.

BACKGROUND ART

As functions of electronic devices diversify, the electronic devices can be implemented as image display devices such as multimedia players having complex functions, for example, playing music or video files, playing games, receiving broadcasts, and the like.

An image display device is a device for reproducing (playing) image contents. Image display devices receive images (videos) from various sources and reproduce the received images. Image display devices are implemented as various devices such as PCs (Personal Computers), smart phones, tablet PCs, laptop computers, TV sets, and the like. An image display device such as a smart TV may provide an application for providing web contents, such as web browsers.

The electronic device such as the image display device may include a communication module having antennas to perform communications with neighboring electronic devices. Meanwhile, as a display area (region) of an image display device is expanded recently, a disposition space of a communication module including antennas is reduced. This causes an increase in necessity of disposing antennas inside a multi-layered circuit board on which the communication module is implemented.

A WiFi radio interface may be considered as an interface for a communication service between electronic devices. When using such a WiFi radio interface, a millimeter wave (mmWave) band may be used for high-speed data transmission between the electronic devices. In particular, the high-speed data transmission between the electronic devices is achieved using a radio interface such as 802.11ay.

In this regard, an array antenna that can operate in a millimeter wave (mmWave) band may be mounted in an antenna module. However, the antenna disposed in the antenna module may be configured as a vertically polarized antenna in addition to a horizontally polarized antenna. When configured as the vertically polarized antenna, the antenna is needed to be disposed vertically. This causes a problem in that the antenna is disposed in a PCB, as a multi-layered substrate configuring the antenna module.

In addition, when a physical size of the antenna is limited to dispose the antenna in the PCB as the multi-layered substrate configuring the antenna module, antenna performance is deteriorated. Particularly, when the physical size of the antenna is limited to dispose the antenna in the PCB as the multi-layered substrate, antenna bandwidth performance is lowered. Therefore, it is necessary to provide the antenna operating in the mmWave band in the form of an integral module with the PCB as the multi-layered substrate, without being implemented separately from the PCB. In this case, the physical size of the antenna is needed to be reduced to dispose the antenna in the PCB as the multi-layered substrate.

DISCLOSURE OF INVENTION

Technical Problem

The present disclosure is directed to solving the aforementioned problems and other drawbacks. Another aspect of the present disclosure is to provide an antenna module operating in a millimeter wave (mmWave) band and an electronic device controlling the same.

Still another aspect of the present disclosure is to provide an antenna module integrally formed with a radio frequency (RF) circuit by disposing an antenna element operating in an mmWave band in a multi-layered substrate.

Still another aspect of the present disclosure is to provide an antenna module that is miniaturized by lowering a height of an antenna element, which is vertically disposed in a PCB as a multi-layered substrate.

Still another aspect of the present disclosure is to provide a broadband feed line structure, capable of improving an impedance matching characteristic of an antenna element, which is electrically connected to a feed line inside a PCB as a multi-layered substrate.

Solution to Problem

To achieve the above or other aspects, an electronic device having an antenna according to one embodiment is provided. The electronic device includes: a radiator configured such that metal patterns are stacked on different layers of a multi-layered substrate; and an antenna module disposed on a specific layer of the radiator and including a feed part with a feed line connected to the radiator. The radiator includes a first pad connected to the feed line, and a second pad disposed on an upper portion of the first pad, and the first pad and the second pad are connected to each other by a first connection line and a second connection line.

According to an embodiment, the electronic device may further include a processor operably connected to the antenna module and configured to control the antenna module to transmit or receive a wireless signal to or from a wireless device disposed adjacent to the electronic device.

According to an embodiment, the first connection line is configured to connect a first end portion of the first pad and a first end portion of the second pad to generate a first inductance component, and the second connection line is configured to connect a second end portion of the first pad and a second end portion of the second pad to generate a second inductance component. The first pad having a first area and the second pad having a second area are spaced apart from each other by a predetermined gap to generate a capacitance component. The radiator may be implemented to have a broadband characteristic by the first and second inductance components and the capacitance component.

According to an embodiment, the feed part may include: the feed line: a first ground layer disposed up to a first region at a lower portion of the feed line in a horizontal direction; and a second ground layer disposed up to a second region, more adjacent to the radiator than the first region, at a lower portion of the first ground layer in the horizontal direction. A first width of the feed line formed in the first region may be different from a second width of the feed line formed in the second region.

According to an embodiment, the feed part may be formed as a stepped ground in which a first height from the feed line to the first ground layer in the first region is higher than a second height from the feed line to the second ground layer in the second region.

According to an embodiment, the feed part may further include an upper ground layer disposed at an upper portion of the feed line, and the feed line may be configured as a strip line by the upper ground layer in the first region and the second region.

According to an embodiment, the first pad and the second pad may be connected to each other by the first connection line, the second connection line, and a third connection line, and the third connection line may be disposed between the first connection line and the second connection line.

According to an embodiment, the first connection line and the second connection line may be disposed on a first axis, and the third connection line may be disposed between the first connection line and the second connection line on the first axis, and may be disposed at a more offset point than the first and second connection lines on a second axis perpendicular to the first axis.

According to an embodiment, the first pad and the second pad may be connected to each other by the first connection line and the second connection line disposed on a first axis, and connected by the first connection line and the third connection line or by the second connection line and the fourth connection line on a second axis perpendicular to the first axis.

According to an embodiment, the antenna module may further include a via wall structure disposed to be spaced apart from the radiator by a predetermined gap in a horizontal direction, and the via wall structure may include a plurality of vertical vias vertically connected to each other between a plurality of pads at a plurality of points.

According to an embodiment, the via wall structure may be configured as a floating via wall that is not electrically connected to a ground of the multi-layered substrate.

According to an embodiment, the radiator may operate as a vertically polarized antenna by the first connection line and the second connection line that vertically connect the first pad and the second pad, and the antenna module may further include a patch antenna disposed on an upper portion of a ground layer within the multi-layered substrate to operate as a horizontally polarized antenna.

According to an embodiment, the radiator may be a first antenna configured to radiate a first signal in a first direction parallel to the multi-layered substrate, and the patch antenna may be a second antenna configured to radiate a second signal in a second direction perpendicular to the multi-layered substrate.

According to an embodiment, the radiator may configure an array antenna by a plurality of radiators spaced apart from each other by a predetermined gap in a first horizontal direction of the multi-layered substrate. The processor may be disposed on the multi-layered substrate with the antenna module. Or, the processor may be disposed on a main substrate disposed inside the electronic device, separately from the antenna module.

According to an embodiment, each of the plurality of radiators may further include a via wall structure disposed to be spaced apart from the radiator by a predetermined gap in a second horizontal direction, and the via wall structure may include a plurality of vertical vias vertically connected to each other between a plurality of at a plurality of points.

According to an embodiment, the array antenna may include a first array antenna module and a second array antenna module spaced apart from the first array antenna module by a predetermined gap in a first horizontal direction, and the processor may form a first beam and a second beam in a first direction and a second direction, respectively, using the first and second array antenna modules, and form a third beam in a third direction using the first array antenna module and the second array antenna module.

According to an embodiment, the processor may perform Multiple-input/multiple-output (MIMO) using the first beam and the second beam, and performs beamforming using the third beam having a narrower beam width than those of the first beam and the second beam.

According to another aspect of the present disclosure, there is provided an antenna module. The antenna module may include: a radiator configured such that metal patterns are stacked on different layers of a multi-layered substrate; and a feed part disposed on a specific layer of the radiator and including a feed part with a feed line connected to the radiator.

According to an embodiment, the radiator may include a first pad connected to the feed line, and a second pad disposed on an upper portion of the first pad, and the first pad and the second pad may be connected to each other by a first connection line and a second connection line.

According to an embodiment, the first connection line is configured to connect a first end portion of the first pad and a first end portion of the second pad to generate a first inductance component, and the second connection line is configured to connect a second end portion of the first pad and a second end portion of the second pad to generate a second inductance component. The first pad having a first area and the second pad having a second area may be spaced apart from each other by a predetermined gap to generate a capacitance component, and the radiator may be implemented to have a broadband characteristic by the first and second inductance components and the capacitance component.

According to an embodiment, the feed part may include: the feed line; a first ground layer disposed up to a first region at a lower portion of the feed line in a horizontal direction; and a second ground layer disposed up to a second region, more adjacent to the radiator than the first region, at a lower portion of the first ground layer in the horizontal direction. A first width of the feed line formed in the first region may be different from a second width of the feed line formed in the second region.

According to an embodiment, the antenna module may further include a via wall structure disposed to be spaced apart from the radiator by a predetermined gap in a horizontal direction, and the via wall structure may include a plurality of vertical vias vertically connected to each other between a plurality of pads at a plurality of points.

According to an embodiment, the via wall structure may be configured as a floating via wall that is not electrically connected to a ground of the multi-layered substrate.

Advantageous Effects of Invention

Hereinafter, technical effects of the antenna module operating in the millimeter wave (mmWave) band and the electronic device controlling the same will be described.

According to an embodiment, an antenna module operating in a millimeter wave (mmWave) band and an electronic device controlling the same can be provided.

According to an embodiment, antenna elements operating in the mmWave band can be disposed inside a multi-layered substrate using a plurality of via structures between via pads, so as to provide an antenna module integral with an RF circuit.

According to an embodiment, an antenna module that is reduced in size by lowering heights of antenna elements vertically disposed inside a multi-layered substrate using a plurality of via structures between via pads can be provided.

According to an embodiment, an antenna module that is reduced in size by lowering heights of antenna elements vertically disposed inside a multi-layered substrate using a plurality of via structures disposed adjacent to the antenna elements in one direction.

According to an embodiment, a feed line connected to a monopole antenna can be tapered, so as to provide a broadband feed line structure that can improve an impedance matching characteristic of an antenna element, which is electrically connected to the feed line inside a multi-layered substrate.

According to an embodiment, a ground of feed line connected to a monopole antenna can be stepped, so as to provide a broadband feed line structure that can improve an impedance matching characteristic of an antenna element, which is electrically connected to the feed line inside a multi-layered substrate.

According to an embodiment, MIMO can be performed using only one antenna module through antennas having orthogonal polarizations.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

MODE FOR THE INVENTION

Figure 1:
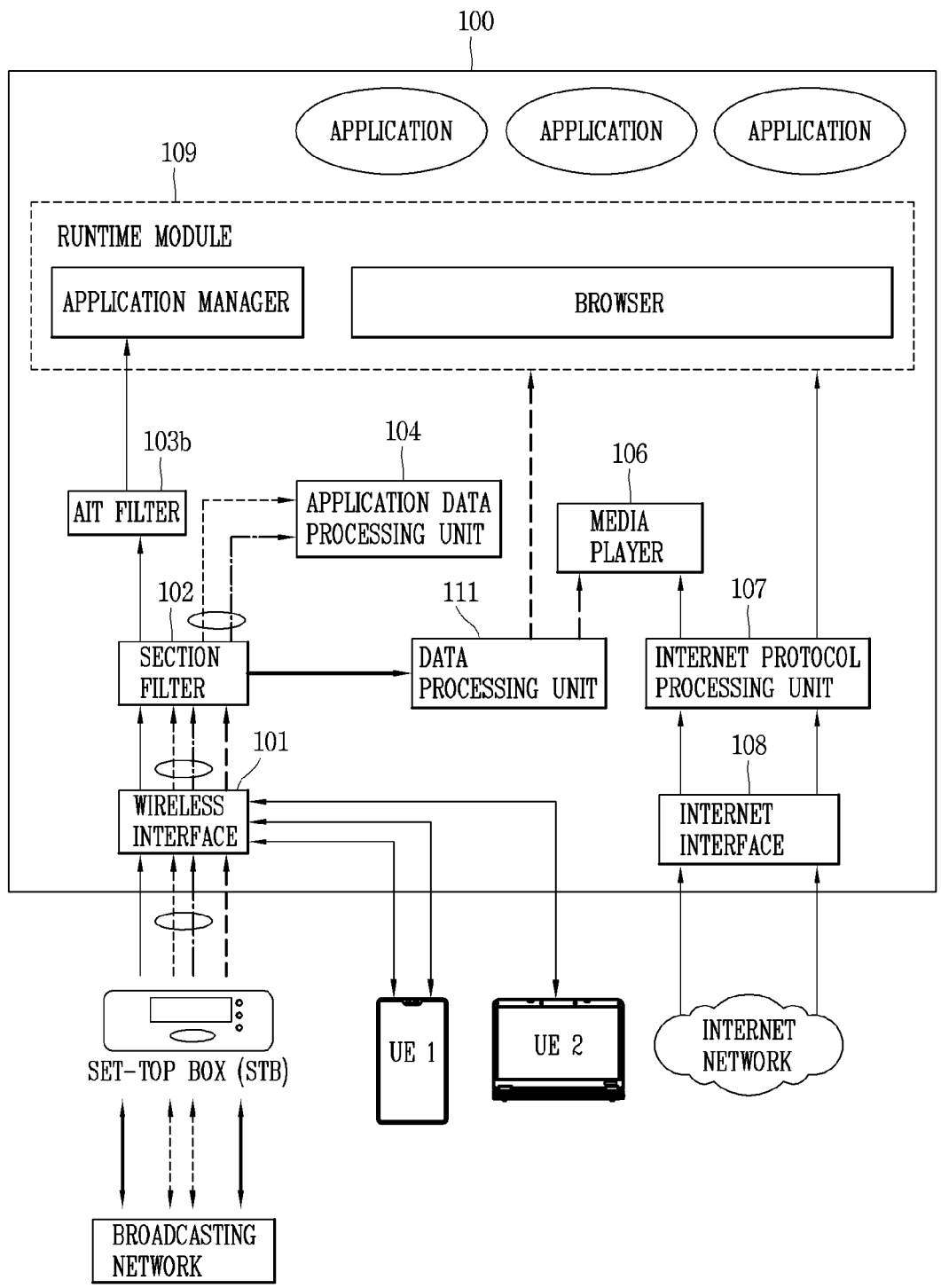
FIG. 1 is a diagram schematically illustrating an example of an entire wireless AV system including an image display device according to one embodiment of the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. A suffix "module" or "unit" used for elements disclosed in the following description is merely intended for easy description of the specification, and the suffix itself is not intended to give any special meaning or function. In describing the embodiments disclosed herein, moreover, the detailed description will be omitted when specific description for publicly known technologies to which the invention pertains is judged to obscure the gist of the present disclosure. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Electronic devices presented herein may be implemented using a variety of different types of terminals. Examples of such devices include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, digital signages, and the like.

FIG. 1 is a diagram schematically illustrating an example of an entire wireless (AV) system including a video display device according to one embodiment of the present disclosure.

As illustrated in FIG. 1, an image display device 100 according to one embodiment of the present disclosure is connected to the wireless AV system (or a broadcasting network) and an Internet network. The image display device 100 may be, for example, a network TV, a smart TV, a hybrid broadcast broadband TV (HBBTV), or the like.

The image display device 100 may be wirelessly connected to the wireless AV system (or the broadcasting network) via a wireless interface or wirelessly or wiredly connected to the Internet network via an Internet interface. In relation to this, the image display device 100 may be configured to be connected to a server or another electronic device via a wireless communication system. As an example, the image display device 100 needs to provide an 802.1 lay communication service operating in a millimeter wave (mmWave) band to transmit or receive large-capacity data at a high speed.

The mmWave band may be any frequency band in a range of 10 GHz to 300 GHz. In this disclosure, the mmWave band may include an 802.11ay band of a 60 GHz band. In addition, the mmWave band may include a 5G frequency band of a 28 GHz band or the 802.1 lay band of the 60 GHz band. The 5G frequency band may be set to about 24 to 43 GHz band and the 802.11ay band may be set to 57 to 70 GHz or 57 to 63 GHz band, but are not limited thereto.

The image display device 100 may wirelessly transmit or receive data to/from an electronic device in a periphery of the image display device 100, e.g., a set-top box or another electronic device via the wireless interface. As an example, the image display device 100 may transmit or receive wireless AV data to/from a set-top box or another electronic device, e.g., a mobile terminal arranged in front of or below the image display device 100.

The image display device 100 includes, for example, a wireless interface 101*b*, a section filter 102*b*, an application information table (AIT) filter 103*b*, an application data processing unit 104*b*, a data processing unit 111*b*, a media player 106*b*, an Internet protocol processing unit 107*b*, an Internet interface 108*b*, and a runtime module 109*b*.

Through a broadcast interface that is the wireless interface 101*b*, AIT data, real-time broadcast content, application data, and a stream event are received. The real-time broadcast content may be referred to as linear audio/video (A/V) content.

The section filter 102*b* performs section filtering on four types of data received through the wireless interface 101*b* to transmit the AIT data to the AIT filter 103*b*, the linear A/V content to the data processing unit 111*b*, and the stream events and the application data to the application data processing unit 104*b*.

Non-linear A/V content and the application data are received through the Internet interface 108*b*. The non-linear A/V content may be, for example, a content on demand (COD) application. The non-linear A/V content is transmitted to the media player 106*b*, and the application data is transmitted to the runtime module 109*b*.

Further, the runtime module 109*b* includes, for example, an application manager and a browser as illustrated in FIG. 1. The application manager controls a life cycle of an interactive application using, for example, the AIT data. In addition, the browser performs, for example, a function of displaying and processing the interactive application.

Hereinafter, a communication module having an antenna for providing a wireless interface in an electronic device such as the above-described image display device will be described in detail. In relation to this, the wireless interface for communication between electronic devices may be a WiFi wireless interface, but is not limited thereto. As an example, a wireless interface supporting the 802.11ay standard may be provided for high-speed data transmission between electronic devices.

The 802.11ay standard is a successor standard for raising a throughput for the 802.11ad standard to 20 Gbps or greater. An electronic device supporting an 802.1 lay wireless interface may be configured to use a frequency band of about 57 to 64 GHz. The 802.11ay wireless interface may be configured to provide backward compatibility for an 802.11ad wireless interface. The electronic device providing the 802.11ay wireless interface may be configured to provide coexistence with a legacy device using the same band.

In relation to a wireless environment for the 802.11ay standard, it may be configured to provide a coverage of 10 meters or longer in an indoor environment, and 100 meters or longer in an outdoor environment with a line of sight (LOS) channel condition.

The electronic device supporting the 802.11ay wireless interface may be configured to provide visual reality (VR) headset connectivity, support server backups, and support cloud applications that require low latency.

An ultra-short range (USR) communication scenario, i.e., a near field communication scenario which is a use case of the 802.11ay wireless interface, is a model for fast large-capacity data exchange between two terminals. The USR communication scenario may be configured to require low power consumption of less than 400 mW, while providing a fast link setup within 100 msec, transaction time within 1 second, and a 10 Gbps data rate at a very close distance of less than 10 cm.

As the use case of the 802.11ay wireless interface, the 8K UHD Wireless Transfer at Smart Home Usage Model may be taken into account. In the Smart Home Usage Model, a wireless interface between a source device and a sync device may be taken into consideration to stream 8K UHD content at home. In relation to this, the source device may be one of a set-top box, a Blue-ray player, a tablet PC, and a smart phone and the sink device may be one of a smart TV and a display device, but are not limited thereto. In relation to this, the wireless interface may be configured to transmit uncompressed 8K UHD streaming data (60 fps, 24 bits per pixel, at least 4:2:2) with a coverage of less than 5 m between the source device and the sink device. To do so, the wireless interface may be configured such that data is transmitted between electronic devices at a speed of at least 28 Gbps.

In order to provide such a wireless interface, embodiments related to an array antenna operating in a mmWave band and an electronic device including the array antenna will be described with reference to the accompanying drawings. It will be apparent to those skilled in the art that the present disclosure may be embodied in other specific forms without departing from the spirit or essential characteristics thereof.

Figure 2:
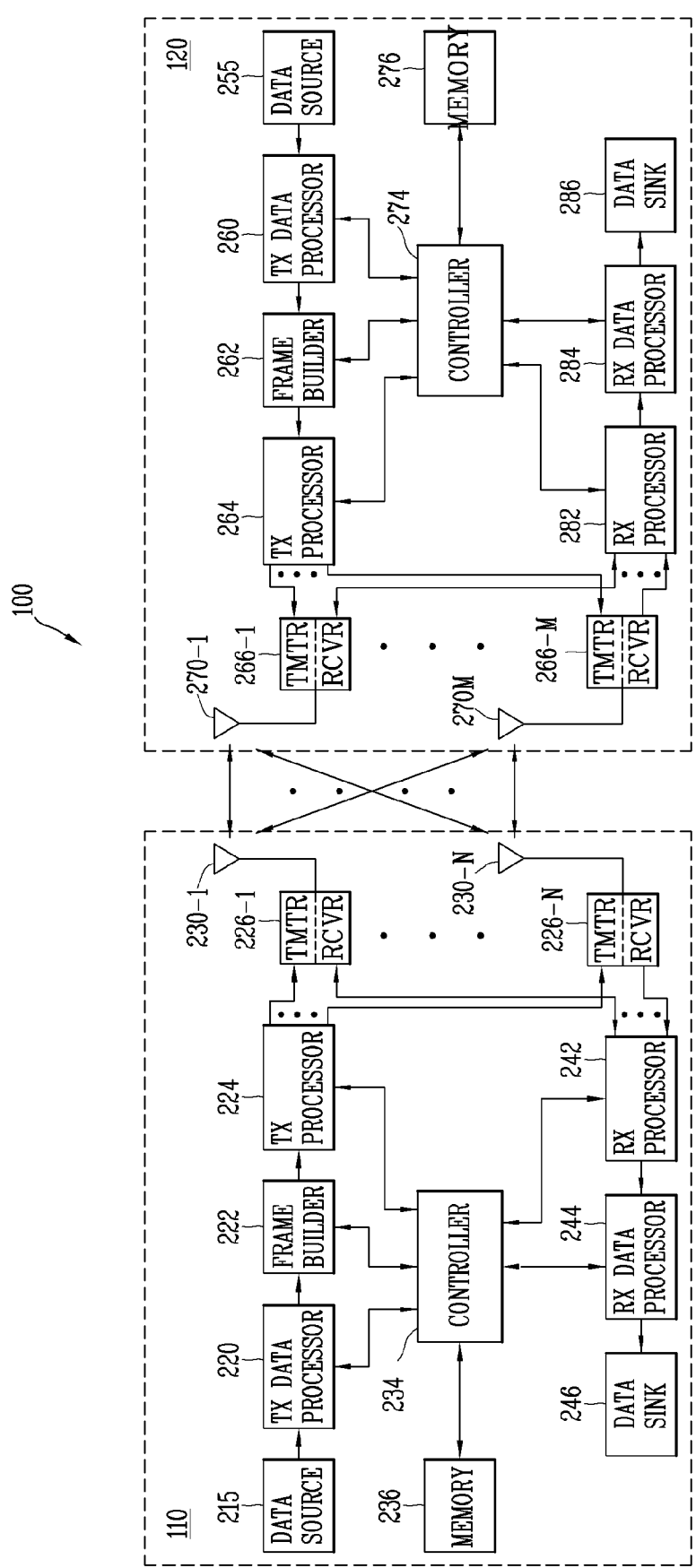
FIG. 2 illustrates a detailed configuration of electronic devices configured to support wireless interfaces according to the present disclosure.

FIG. 2 illustrates a detailed configuration of electronic devices configured to support a wireless interface according to the present disclosure. FIG. 2 illustrates a block diagram of an access point 110 (generally, a first wireless node) and an access terminal 120 (generally, a second wireless node) in a wireless communication system. The access point 110 is a transmitting entity for downlink transmission and a receiving entity for uplink transmission. The access terminal 120 is a transmitting entity for uplink transmission and a receiving entity for downlink transmission. As used herein, the "transmitting entity" is an independently operating apparatus or device capable of transmitting data through a wireless channel, and the "receiving entity" is an independently operating apparatus or device capable of receiving data through a wireless channel.

Referring to FIGS. 1 and 2, the set-top box (STB) of FIG. 1 may be the access point 110, and an electronic device, that is, the image display device 100 of FIG. 1 may be the access terminal 120, but are not limited thereto. Accordingly, it should be understood that the access point 110 may alternatively be an access terminal, and the access terminal 120 may alternatively be an access point.

To transmit data, the access point 110 includes a transmission (TX) data processor 220, a frame builder 222, a TX processor 224, a plurality of transceivers 226-1 to 226-N, and a plurality of antennas 230-1 to 230-N. The access point 110 also includes a controller 234 configured to control operations of the access point 110.

To transmit data, the access point 110 includes a transmission (TX) data processor 220, a frame builder 222, a TX processor 224, a plurality of transceivers 226-1 to 226-N, and a plurality of antennas 230-1 to 230-N. The access point 110 also includes a controller 234 configured to control operations of the access point 110.

During operation, the TX data processor 220 receives data (e.g., data bits) from a data source 215, and processes the data for transmission. For example, the TX data processor 220 may encode data (e.g., data bits) into encoded data, and modulate the encoded data into data symbols. The TX data processor 220 may support different modulation and coding schemes (MCSs). For example, the TX data processor 220 may encode data at any one of a plurality of different coding rates (e.g., using low-density parity check (LDPC) encoding). In addition, the TX data processor 220 may modulate the encoded data using any one of a plurality of different modulation schemes including, but not limited to, BPSK, QPSK, 16QAM, 64QAM, 64APSK, 128APSK, 256QAM, and 256APSK.

The controller 234 may transmit, to the TX data processor 220, a command for specifying an MCS to be used (e.g., based on channel conditions for downlink transmission). The TX data processor 220 may encode and modulate the data received from the data source 215 according to the specified MCS. It needs to be recognized that the TX data processor 220 may perform additional processing on the data, such as data scrambling and/or other processing. The TX data processor 220 outputs the data symbols to the frame builder 222.

The frame builder 222 constructs a frame (also referred to as a packet) and inserts the data symbols into a data payload of the frame. The frame may include a preamble, a header, and a data payload. The preamble may include a short training field (STF) sequence and a channel estimation (CE) sequence to assist the access terminal 120 in receiving the frame. The header may include information regarding data in a payload, such as a length of the data and an MCS used to encode and modulate the data. Based on this information, the access terminal 120 may demodulate and decode the data. The data in the payload may be partitioned among a plurality of blocks, and each block may contain a part of the data and a guard interval (GI) to assist the receiver in phase tracking. The frame builder 222 outputs the frame to the TX processor 224.

The TX processor 224 processes the frame for transmission on downlink. For example, the TX processor 224 may support different transmission modes, e.g., an orthogonal frequency-division multiplexing (OFDM) transmission mode and a single-carrier (SC) transmission mode. In this example, the controller 234 may transmit, to the TX processor 224, a command for specifying a transmission mode to be used, and the TX processor 224 may process the frame for transmission according to the specified transmission mode. The TX processor 224 may apply a spectrum mask to the frame so that a frequency configuration of a downlink signal complies with particular spectrum requirements.

The TX processor 224 may support multiple-input-multiple-output (MIMO) transmission. In these aspects, the access point 110 may include a plurality of antennas 230-1 to 230-N and a plurality of transceivers 226-1 to 226-N (e.g., one for each antenna). The TX processor 224 may perform spatial processing on incoming frames and provide a plurality of transmission frame streams to a plurality of antennas. The transceivers 226-1 to 226-N receive and process (e.g., convert to analog, amplify, filter, and frequency up-convert) each of the transmission frame streams to generate transmission signals for transmission through the antennas 230-1 to 230-N.

To transmit data, the access terminal 120 includes a TX data processor 260, a frame builder 262, a TX processor 264, a plurality of transceivers 266-1 to 266-M, and a plurality of antennas 270-1 to 270-M (e.g., one antenna per transceiver). The access terminal 120 may transmit data to the access point 110 on uplink and/or transmit the data to another access terminal (e.g., for peer-to-peer communication). The access terminal 120 also includes a controller 274 configured to control operations of the access terminal 120.

The transceivers 266-1 to 266-M receive and process (e.g., convert to analog, amplify, filter, and frequency up-convert) an output from the TX processor 264 for transmission via one or more of the antennas 270-1 to 270-M. For example, the transceiver 266-1 may up-convert the output from the TX processor 264 into a transmission signal having a frequency in a 60 GHz band. Accordingly, the antenna module described herein may be configured to perform a beamforming operation in the 60 GHz band, for example, in a band of about 57 to 63 GHZ. In addition, the antenna module may be configured to support MIMO transmission while performing beamforming in the 60 GHz band.

In relation to this, the antennas 270-1 to 270-M and the transceivers 266-1 to 266-M may be implemented in an integrated form on a multi-layer circuit substrate. To do so, among the antennas 270-1 to 270-M, an antenna configured to operate with vertical polarization may be vertically arranged inside the multi-layer circuit substrate.

To receive data, the access point 110 includes a reception (RX) processor 242 and an RX data processor 244. During operation, the transceivers 226-1 to 226-N receive a signal (e.g., from the access terminal 120) and spatially process (e.g., frequency down-convert, amplify, filter, and digitally convert) the received signal.

The RX processor 242 receives outputs from the transceivers 226-1 through 226-N and processes the outputs to recover data symbols. For example, the access point 110 may receive data from a frame (e.g., from the access terminal 120). In this example, the RX processor 242 may detect a start of the frame using a short training field (STF) sequence in a preamble of the frame. The RX processor 242 may also use the STF for automatic gain control (AGC) adjustment. The RX processor 242 may also perform channel estimation (e.g., using a channel estimation (CE) sequence in the preamble of the frame), and perform channel equalization on the received signal based on the channel estimation.

The RX data processor 244 receives data symbols from the RX processor 242 and an indication of a corresponding MSC scheme from the controller 234. The RX data processor 244 demodulates and decodes the data symbols, recovers the data according to the indicated MSC scheme, and stores and/or outputs the recovered data (e.g., data bits) to a data sink 246 for additional processing.

The access terminal 120 may transmit the data using an orthogonal frequency-division multiplexing (OFDM) transmission mode or a single-carrier (SC) transmission mode. In this case, the RX processor 242 may process the received signal according to a selected transmission mode. In addition, as described above, the TX processor 264 may support MIMO transmission. In this case, the access point 110 includes the antennas 230-1 to 230-N and the transceivers 226-1 to 226-N (e.g., one for each antenna). Accordingly, the antenna module described herein may be configured to perform a beamforming operation in the 60 GHz band, for example, in a band of about 57 to 63 GHz. In addition, the antenna module may be configured to support MIMO transmission while performing beamforming in the 60 GHz band.

In relation to this, the antennas 230-1 to 230-M and the transceivers 226-1 to 226-M may be implemented in an integrated form on a multi-layer circuit substrate. To do so, among the antennas 230-1 to 230-M, an antenna configured to operate with vertical polarization may be vertically arranged inside the multi-layer circuit substrate.

Meanwhile, each transceiver receives and processes (e.g., frequency down-converts, amplifies, filters, and digitally converts) a signal from each antenna. The RX processor 242 may perform spatial processing on the outputs from the transceivers 226-1 to 226-N to recover the data symbols.

The access point 110 also includes a memory 236 coupled to the controller 234. The memory 236 may store commands that, when executed by the controller 234, cause the controller 234 to perform one or more of the operations described herein. Similarly, the access terminal 120 also includes a memory 276 coupled to the controller 274. The memory 276 may store commands that, when executed by the controller 274, cause the controller 274 to perform one or more of the operations described herein.

Figure 3A:
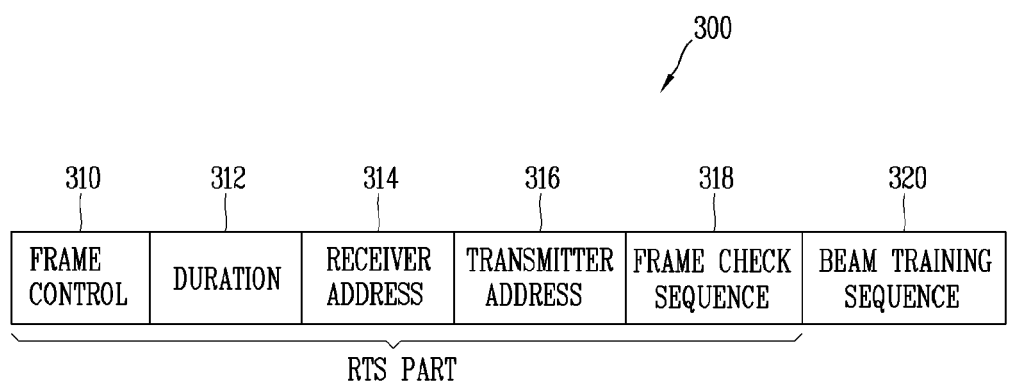
FIG. 3A illustrates a request to send (RTS) and a clear to send (CTS) according to the present disclosure.

Meanwhile, an electronic device supporting 802.11ay wireless interface according to the present disclosure determines whether or not a communication medium is available to communicate with other electronic devices. To this end, the electronic device transmits a Request to Send (RTS)-TRN frame including an RTS part and a first beam training sequence. In this regard, FIG. 3A illustrates a Request to Send (RTS) and a Clear to Send (CTS) according to the present disclosure. A transmitting device may use an RTS frame to determine whether a communication medium is available to transmit one or more data frames to a destination device. In response to the reception of the RTS frame, the destination device transmits a CTS frame to the transmitting device when the communication medium is available. In response to the reception of the CTS frame, the transmitting device transmits the one or more data frames to the destination device. In response to the successful reception of the one or more data frames, the destination device transmits one or more acknowledgment ("ACK") frames to the transmitting device.

Referring to (a) of FIG. 3A, a frame 300 includes an RTS part including a frame control field 310, a duration field 312, a receiver address field 314, a transmitter address field 316, and a frame check sequence field 318. For the purpose of improved communication and interference reduction, the frame 300 further includes a beam training sequence field 320 to configure antennas of a destination device and one or more neighboring devices, respectively.

Referring to (b) of FIG. 3A, a CTS frame 350 includes a CTS part including a frame control field 360, a duration field 362, a receiver address field 314, and a frame check sequence field 366. For the purpose of improved communication and interference reduction, the frame 350 further includes a beam training sequence field 368 to configure antennas of a transmitting device and one or more neighboring devices, respectively.

The beam training sequence fields 320 and 368 may comply with the training (TRN) sequence in accordance with IEEE 802.11ad or 802.11ay. The transmitting device may use the beam training sequence field 368 to configure its antenna for directional transmission to the destination device. On the other hand, the transmitting devices may use the beam training sequence field to configure their own antennas to reduce transmission interference at the destination device. In this case, the transmitting devices may use the beam training sequence field to configure their own antennas to generate antenna radiation patterns with nulls aimed at the destination device.

Therefore, electronic devices supporting 802.11ay wireless interface may form initial beams to have a low interference level therebetween using beamforming patterns determined according to the beam training sequence. In this regard, FIG. 3B is a block diagram illustrating a communication system 400 according to an example of the present disclosure. As illustrated in FIG. 3B, first and second devices 410 and 420 may improve communication performance by matching directions of main beams. On the other hand, the first and second devices 410 and 420 may form signal-null having weak signal intensity in a specific direction, in order to reduce interference with a third device 430.

In relation to the formation of the main beam and the signal-null, a plurality of electronic devices according to the present disclosure may perform beamforming through array antennas. Referring to FIG. 3B, some of the plurality of electronic devices may alternatively be configured to perform communication with an array antenna of another electronic device through a single antenna. In this regard, when performing communication through the single antenna, a beam pattern is formed as an omnidirectional pattern.

Referring to FIG. 3B, the first to third devices 410 to 430 perform beamforming but a fourth device 440 does not perform beamforming, but the present disclosure is not limited thereto. Therefore, it may alternatively be configured such that three of the first to fourth devices 410 to 440 perform beamforming and the other may not perform beamforming.

As another example, it may be configured such that any one of the first to fourth devices 410 to 440 performs beamforming and the remaining three devices do not perform beamforming. As still another example, it may be configured such that two of the first to fourth devices 410 to 440 perform beamforming and the remaining two devices do not perform beamforming. As still another example, all the first to fourth devices 410 to 440 may be configured to perform beamforming.

Referring to FIGS. 3A and 3B, the first device 410 determines that it is an intended receiving device of the CTS-TRN frame 350 on the basis of an address displayed on the receiver address field 364 of the CTS-TRN frame 350. In response to the determination as the intended receiving device of the CTS-TRN frame 350, the first device 410 may use the beam training sequence of the beam training sequence field 368 of the received CTS-TRN 350 to configure its own antenna for a directional transmission substantially and selectively aimed at the second device 420. That is, the antenna of the first device 410 is configured to generate a primary lobe (e.g., highest gain lobe) substantially aimed at the second device 420, and an antenna radiation pattern with non-primary lobes aimed at other directions.

The second device 420 already knows the direction toward the first device 410 based on the beam training sequence of the beam training sequence field 320 of the previously-received RTS-TRN frame 300. Therefore, the second device 420 may configure its own antenna for a directional reception (e.g., primary antenna radiation lobe) selectively aimed at the first device 410. Therefore, while the antenna of the first device 410 is configured for the directional transmission toward the second device 420 and the antenna of the second device 420 is configured for the directional reception from the first device 410, the first device 410 transmits one or more data frames to the second device 420. Accordingly, the first and second devices 410 and 420 perform directional transmission/reception (DIR-TX/RX) of the one or more data frames through the primary lobe (main beam).

On the other hand, the first and second devices 410 and 420 may partially modify the beam pattern of the third device 430 to reduce interference with the third device 430 due to an antenna radiation pattern with the non-primary lobes.

In this regard, the third device 430 determines that it is not an intended receiving device of the CTS-TRN frame 350 on the basis of an address indicated in the receiver address field 364 of the CTS-TRN frame 350. In response to the determination that it is not the intended receiving device of the CTS-TRN frame 350, the third device 430 uses the beam training sequence of the beam training sequence field 368 of the received CTS-TRN 350 and the sequence of the beam training sequence field 320 of the previously-received RTS-TRN frame 300, in order to configure its antenna to generate antenna radiation patterns each with nulls substantially aimed at the second device 420 and the first device 410. The nulls may be based on estimated arrival angles of the previously-received TRS-TRN frame 300 and CTS-TRN frame 350. In general, the third device 430 generates antenna radiation patterns with desired signal power, refusals, or gains aimed at the first device 410 and the second device 420 such that estimated interferences at the first and second devices 410 and 420 are equal to or lower than a defined threshold value (e.g., to achieve a desired bit error rate (BER), signal-to-noise ratio (SNR), signal-to-interference ratio (SINR), and/or other one or more communication attributes).

The third device 430 may configure its antenna transmission radiation pattern by estimating antenna gains in directions toward the first and second devices 410 and 420, estimating antenna mutuality differences (e.g., transmitting antenna gain-receiving antenna gain) between the third device 430 and the first and second devices 410 and 420, and calculating those values over one or more sectors for determining corresponding estimated interferences at the first and second devices 410 and 420.

The third device 430 transmits the RTS-TRN frame 300 intended for the fourth device 440, which the fourth device 440 receives. The third device 430 maintains an antenna configuration with nulls aimed at the first and second devices 410 and 420 as long as the first device 410 and the second device 420 are communicating based on durations displayed on the duration fields 312 and 362 of the RTS-TRN frame 300 and the CTS-TRN frame 350, respectively. As the antenna of the third device 430 is configured to produce the nulls aimed at the first device 410 and the second device 420, the transmission of the RTS-TRN frame 300 by the third device 430 may produce reduced interferences at the first device 410 and the second device 420.

Therefore, electronic devices supporting the 802.11 ay wireless interface disclosed herein can form a signal-null in a specific direction for interference reduction while matching a main beam direction therebetween using array antennas. To this end, the plurality of electronic devices may form an initial beam direction through a beam training sequence, and change the beam direction through the periodically updated beam training sequence.

As aforementioned, the beam directions should be matched between the electronic devices for high-speed data communication between the electronic devices. Also, the loss of wireless signals transmitted to an antenna element should be minimized for the high-speed data communication. To this end, the array antenna should be disposed inside a multi-layered substrate on which an RFIC is disposed. Also, the array antenna is necessarily disposed adjacent to a side area inside the multi-layered substrate for radiation efficiency.

In addition, the beam training sequence should be updated to adapt to the change of a wireless environment. To update the beam training sequence, the RFIC should periodically transmit and receive signals to and from a processor such as a modem. Therefore, control signal transmission and reception between the RFIC and the modem should also be carried out within fast time to minimize an update delay time. To this end, a physical length of a connection path between the RFIC and the modem should be reduced. To this end, the modem may be disposed on the multi-layered substrate on which the array antenna and the RFIC are disposed. Or, in the structure that the array antenna and the RFIC are disposed on the multi-layered substrate and the modem is disposed on a main substrate, the connection length between the RFIC and the modem may be minimized. A detailed structure thereof will be described later with reference to FIG. 5C.

Figure 4:
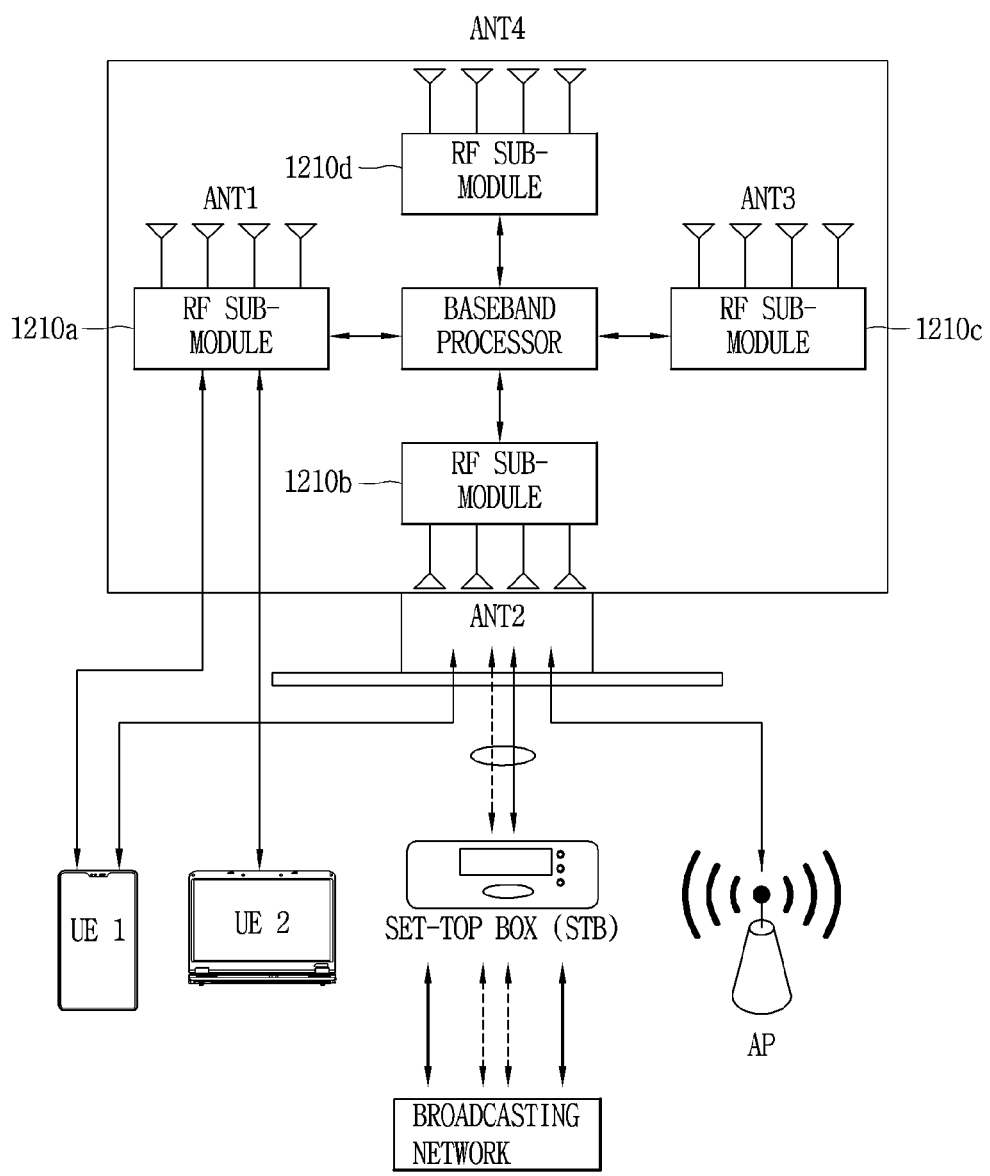
FIG. 4 is a diagram illustrating an electronic device including a plurality of antenna modules and a plurality of transceiver circuit modules in accordance with one embodiment.

Hereinafter, an electronic device having an array antenna that can operate in a mmWave band will be described. In this regard, FIG. 4 is a diagram illustrating an electronic device including a plurality of antenna modules and a plurality of transceiver circuit modules in accordance with one embodiment. Referring to FIG. 4, a home appliance in which a plurality of antenna modules and a plurality of transceiver circuit modules are disposed may be a television, but is not limited thereto. Therefore, the home appliance having the plurality of antenna modules and the plurality of transceiver circuit modules disclosed herein may include an arbitrary home appliance or display device that supports a communication service in a millimeter wave band.

Referring to FIG. 4, the electronic device 1000 includes a plurality of antenna modules ANT1 to ANT4 and a plurality of transceiver circuit modules 1210a to 1210d. In this regard, the plurality of transceiver circuit modules 1210a to 1210d may correspond to the aforementioned transceiver circuit 1250. Or, the plurality of transceiver circuit modules 1210a to 1210d may be a partial configuration of the transceiver circuit 1250 or a partial configuration of a front end module disposed between the antenna module and the transceiver circuit 1250.

The plurality of antenna modules ANT1 to ANT4 may be configured as array antennas with a plurality of antenna elements. The number of elements of each antenna module ANT1 to ANT4 may be two, three, four, and the like as aforementioned, but it not limited thereto. For example, the number of antenna modules ANT1 to ANT4 may be expanded to two, four, eight, sixteen, and the like. Also, the elements of the antenna modules ANT1 to ANT4 may be selected by the same number or different numbers. The plurality of antenna modules ANT1 to ANT4 may be disposed on different areas of the display or on a bottom or side surface of the electronic device. The plurality of antenna modules ANT1 to ANT4 may be disposed on top, left, bottom, and right sides of the display, but the present disclosure is not limited thereto. As another example, the plurality of antenna modules ANT1 to ANT4 may alternatively be disposed on a left top portion, a right top portion, a left bottom portion, and a right bottom portion of the display.

The antenna modules ANT1 to ANT4 may be configured to transmit and receive signals at an arbitrary frequency band in a specific direction. For example, the antenna modules ANT1 to ANT4 may operate at one of 20 GHz band, 39 GHz band, and 64 GHz band.

The electronic device may maintain a connection state with different entities through two or more of the antenna modules ANT1 to ANT4 or perform data transmission or reception therefor. In this regard, the electronic device corresponding to the display device may transmit or receive data to or from a first entity through the first antenna module ANT1. The electronic device may transmit or receive data to or from a second entity through the second antenna module ANT2. As one example, the electronic device may transmit or receive data to or from a mobile terminal (User Equipment (UE)) through the first antenna module ANT1. The electronic device may transmit or receive data to or from a control device such as a set-top box or access point (AP) through the second antenna module ANT2.

The electronic device may transmit or receive data to or from other entities through the other antenna modules, for example, the third antenna module ANT3 and the fourth antenna module ANT4. As another example, the electronic device may perform dual connectivity or MIMO with at least one of previously-connected first and second entities through the third antenna module ANT3 and the fourth antenna module ANT4.

The mobile terminals UE1 and UE2 may be disposed on a front area of the electronic device to communicate with the first antenna module ANT1. On the other hand, the set-top box STB or the AP may be disposed on a bottom area of the electronic device to communicate with the second antenna module ANT2 but is not limited thereto. As another example, the second antenna module ANT2 may include a first antenna radiating a signal to the bottom area, and a second antenna radiating a signal to a front area. Therefore, the second antenna module ANT2 may perform communication with the set-top box STB or the AP through the first antenna, and perform communication with one of the mobile terminals UE1 and UE2 through the second antenna.

Meanwhile, one of the mobile terminals UE1 and UE2 may be configured to perform MIMO with the electronic device. As one example, the UE1 may be configured to perform MIMO while performing beamforming with the electronic device. As aforementioned, the electronic device corresponding to the image display device may perform high-speed communication with another electronic device or set-top box through a WiFi wireless interface. As one example, the electronic device may perform high-speed communication with another electronic device or set-top box at 60 GHz through 802.11ay wireless interface.

In the meantime, the transceiver circuit modules 1210a to 1210d may operate to process transmission signals and reception signals at RF frequency bands. Here, the RF frequency bands, as aforementioned, may be arbitrary mmWave frequency bands, such as 28 GHz, 39 GHz, and 64 GHz. The transceiver circuit modules 1210a to 1210d may be referred to as RF sub-modules 1210a to 1210d. At this time, the number of RF sub-modules 1210a to 1210d may not be limited to four, but may vary to an arbitrary number more than two depending on an application.

Also, the RF sub-modules 1210a to 1210d may include an up-conversion module and a down-conversion module that convert a signal of an RF frequency band into a signal of an IF frequency band or a signal of an IF frequency band into a signal of an RF frequency band. To this end, the up-conversion module and the down-conversion module may include a local oscillator (LO) that can perform up-frequency conversion and down-frequency conversion.

The plurality of RF sub-modules 1210*a* to 1210*d* may be configured such that a signal is transmitted from one of the plurality of transceiver circuit modules to an adjacent transceiver circuit module. Accordingly, the transmitted signal can be transmitted at least one time to all of the plurality of transceiver circuit modules 1210*a* to 1210*d*.

To this end, a data transfer path in a loop structure may be additionally provided. In this regard, the adjacent RF sub-modules 1210*b* and 1210*c* may be allowed to perform a bi-directional signal transfer through a transfer path P2 with the loop structure.

Or, a data transfer path in a feedback structure may be additionally provided. In this regard, at least one RF sub-module 1210*c* is allowed to perform a uni-directional signal transfer to the other RF sub-modules 1210*a*, 1210*b*, and 1210*c* through the data transfer path with the feedback structure.

The plurality of RF sub-modules may include a first RF sub-module to a fourth RF sub-module 1210*a* to 1210*d*. In this regard, a signal may be transferred from the first RF sub-module 1210*a* to the adjacent second RF sub-module 1210B and fourth RF sub-module 1210*d*. Also, the second RF sub-module 1210*b* and the fourth RF sub-module 1210*d* may transfer the signal to the adjacent third RF sub-module 1210*c*. At this time, when the second RF sub-module 1210*b* and the third RF sub-module 1210*c* are available to transmit signals bidirectionally, it may be referred to as the loop structure. On the other hand, when the second RF sub-module 1210*b* and the third RF sub-module 1210*c* are available to merely transmit signals unidirectionally, it may be referred to as the feedback structure. In the feedback structure, at least two signals may be transferred to the third RF sub-module 1210*c*.

However, with no limit to this, the baseband module may be disposed in a specific module of the first to fourth RF sub-modules 1210*a* to 1210*d* depending on applications. Or, depending on applications, the baseband module may not be disposed in the first to fourth RF sub-modules 1210*a* to 1210*d*, but may be configured as a separate controller, namely, a baseband processor 1400. For example, a control signal transfer may alternatively be carried out only by the separate controller, namely, the baseband processor 1400.

Figure 3A:
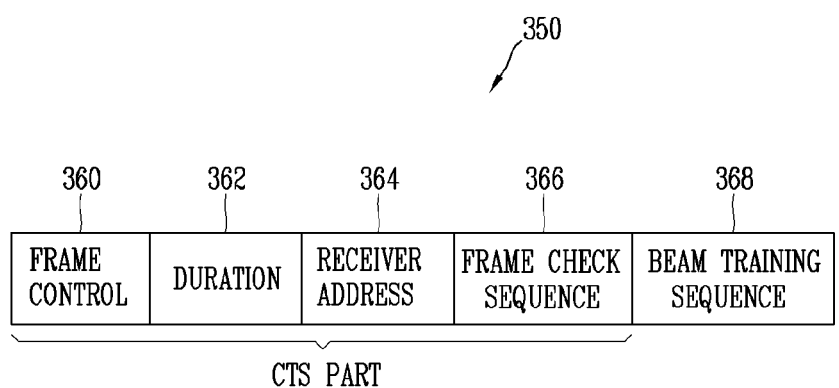
Figure 3B:
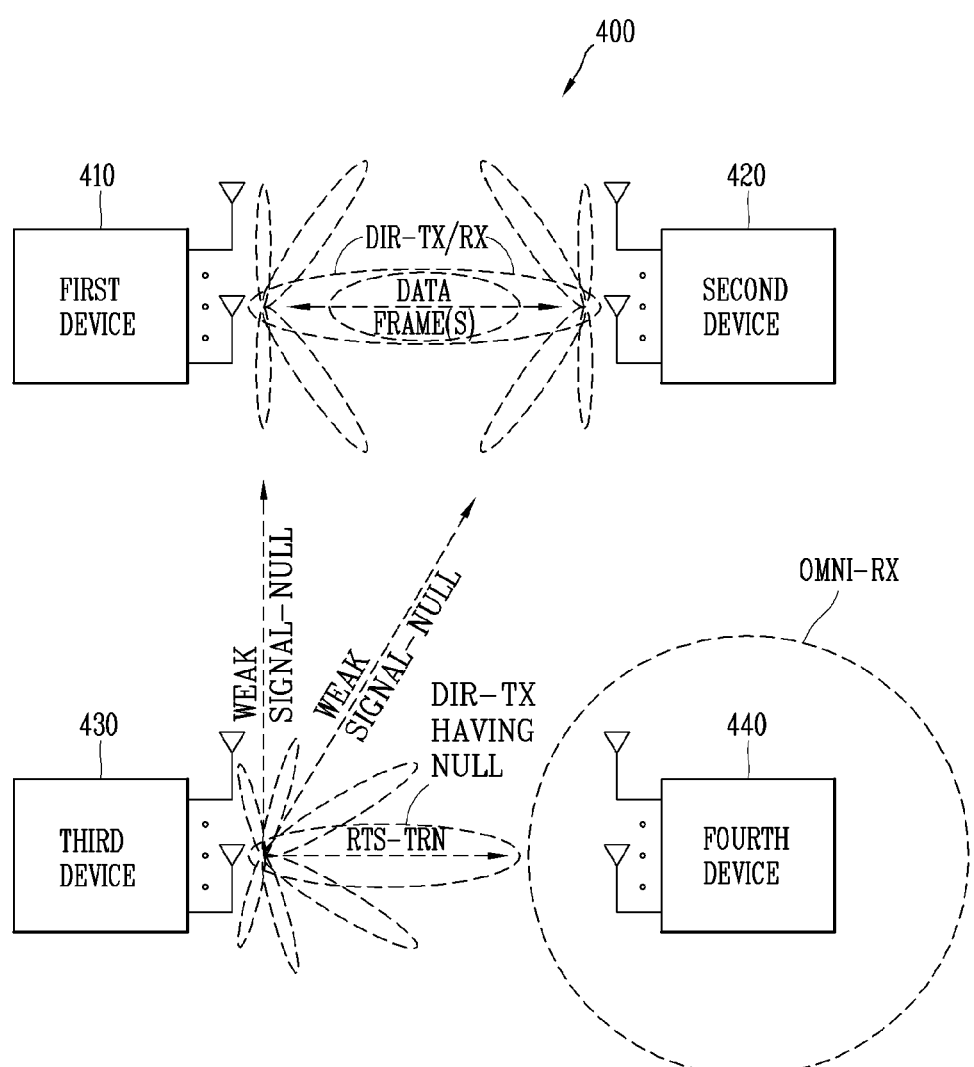
FIG. 3B is a block diagram illustrating a communication system 400 according to an example of the present disclosure.

Hereinafter, a description will be given of detailed configuration and functions of the electronic device having antennas that may be disposed inside or on side surfaces of the multi-transceiver system as illustrated in FIG. 3 and the electronic device of FIG. 4, in the electronic device as illustrated in FIGS. 1 to 2B.

The electronic device such as the image display device may include a communication module having antennas to perform communications with neighboring electronic devices. Meanwhile, as a display area (region) of an image display device is expanded recently, a disposition space of a communication module including antennas is reduced. This causes an increase in necessity of disposing antennas inside a multi-layered circuit board on which the communication module is implemented.

A WiFi radio interface may be considered as an interface for a communication service between electronic devices. When using such a WiFi radio interface, a millimeter wave (mmWave) band may be used for high-speed data transmission between the electronic devices. In particular, the high-speed data transmission between the electronic devices is achieved using a radio interface such as 802.11ay.

In this regard, an array antenna that can operate in a millimeter wave (mmWave) band may be mounted in an antenna module. However, the antenna disposed in the antenna module may be configured as a vertically polarized antenna in addition to a horizontally polarized antenna. When configured as the vertically polarized antenna, the antenna is needed to be disposed vertically. This causes a problem in that the antenna is disposed in a PCB, as a multi-layered substrate configuring the antenna module.

In addition, when a physical size of the antenna is limited to dispose the antenna in the PCB as the multi-layered substrate configuring the antenna module, antenna performance is deteriorated. Particularly, when the physical size of the antenna is limited to dispose the antenna in the PCB as the multi-layered substrate, antenna bandwidth performance is lowered.

The present disclosure is directed to solving the aforementioned problems and other drawbacks. Another aspect of the present disclosure is to provide an antenna module having an antenna operating in a millimeter wave (mmWave) band and an electronic device controlling the same.

Still another aspect of the present disclosure is to provide an antenna module integrally formed with a radio frequency (RF) circuit by disposing an antenna element operating in an mmWave band in a multi-layered substrate.

Still another aspect of the present disclosure is to provide an antenna module that is miniaturized by lowering a height of an antenna element, which is vertically disposed in a multi-layered substrate.

Still another aspect of the present disclosure is to provide a broadband feed line structure, capable of improving an impedance matching characteristic of an antenna element, which is electrically connected to a feed line inside a multi-layered substrate.

Hereinafter, a description will be given of detailed configuration and functions of the electronic device as illustrated in FIG. 1, having wireless interfaces as illustrated in FIG. 2. Electronic devices are needed to transmit or receive data therebetween using communication services at an mmWave band. In this regard, wireless audio-video (AV) service and/or high-speed data transmission may be provided by using 802.11ay wireless interface as the mmWave wireless interface. In this case, the mmWave wireless interface is not limited to the 802.11ay wireless interface, but an arbitrary wireless interface of 60 GHz may be applied. In this regard, a 5G or 6G wireless interface that uses 28 GHz band or 60 GHz band may alternatively be used for high-speed data transmission between electronic devices.

There is no detailed solution to antenna and radio frequency integrated chip (RFIC) providing a wireless interface in an electronic device such as an image display device for transferring images with resolution over 4K. Specifically, considering a situation that the electronic device such as the image display device is disposed on a wall of a building or a table, the electronic device is needed to transmit or receive wireless AV data to or from another electronic device. To this end, a detailed configuration and antenna structure for determining an area of the image display device to dispose the antenna and RFIC should be proposed.

Figure 5A:
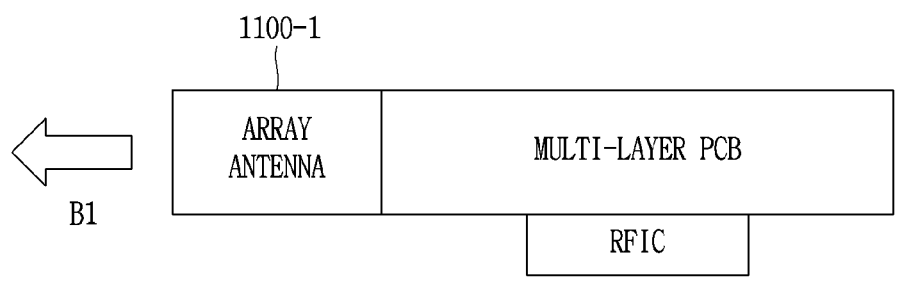
FIG. 5A illustrates a configuration, in which a multi-layered circuit board having an array antenna module thereon is connected to an RFIC, in relation to the present disclosure.
Figure 5A:
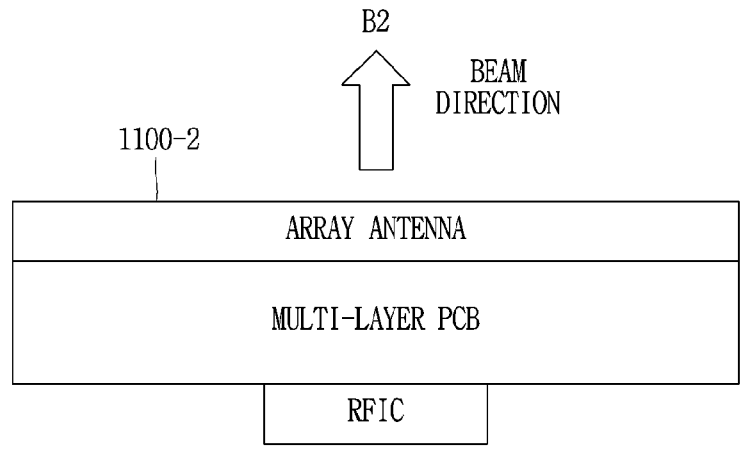

In this regard, FIG. 5A illustrates a configuration, in which a multi-layered circuit board having an array antenna module thereon is connected to an RFIC, in relation to the present disclosure. In detail, FIG. 5A illustrates an antenna in package (AIP) module structure and an antenna module structure implemented on a flexible substrate, in relation to the present disclosure.

Referring to (a) of FIG. 5A, the AIP module is disposed for mmWave band communication, and configured as an integral form of RFIC-PCB-antenna. In this regard, an array antenna module 1100-1, as illustrated in (a) of FIG. 5, may be formed integrally with a multi-layered PCB. Therefore, the array antenna module 1100-1 integrally formed with the multi-layered PCB may be referred to as the AIP module. In detail, the array antenna module 1100-1 may be disposed on one side area of the multi-layered PCB. Accordingly, a first beam B1 may be formed toward the side area of the multi-layered PCB by using the array antenna module 1100-1 disposed on the one side area of the multi-layered PCB.

On the other hand, referring to (b) of FIG. 5A, an array antenna module 1100-2 may be disposed on a top of the multi-layered PCB. The disposition of the array antenna module 1100-2 is not limited to the structure of (b) of FIG. 5A, but may alternatively be disposed on an arbitrary layer inside the multi-layered PCB. Accordingly, a second beam B2 may be formed toward a front area of the multi-layered PCB by using the array antenna module 1100-2 disposed on the arbitrary layer of the multi-layered PCB. The AIP module integrally formed with the array antenna module may be configured such that an array antenna is disposed on the same PCB to minimize a distance between the RFIC and the antenna.

On the other hand, the antenna of the AIP module may be produced through a multi-layered PCBA manufacturing process, and may radiate a signal in a vertical/lateral direction of the PCB. In this regard, dual polarization may be realized by using a patch antenna, a dipole/monopole antenna, or the like. Therefore, the first array antenna 1100-1 of (a) of FIG. 5A may be disposed on one side area of the multi-layered PCB and the second array antenna 1100-2 of (b) of FIG. 5A may be disposed on another side area of the multi-layered PCB. Accordingly, the first beam B1 may be generated through the first array antenna 1100-1 and the second beam B2 may be generated through the second array antenna 1100-2.

The first array antenna 1100-1 and the second array antenna 1100-2 may be configured to be in the same polarization. Or, the first array antenna 1100-1 and the second array antenna 1100-2 may be configured to be in orthogonal polarizations to each other. In this regard, the first array antenna 1100-1 may operate as a vertically polarized antenna and the second array antenna 1100-2 may operate as a horizontally polarized antenna. As one example, the first array antenna 1100-1 may be a monopole antenna having the vertical polarization and the second array antenna may be a patch antenna having the horizontal polarization.

Figure 5B:
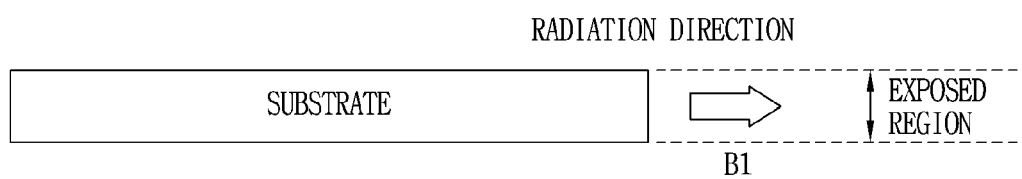
FIG. 5B is a conceptual view illustrating antenna structures having different radiation directions.
Figure 5B:
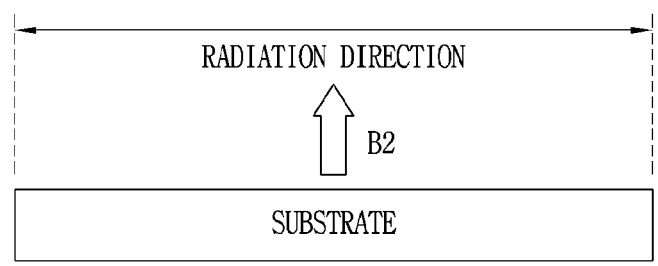

On the other hand, FIG. 5B is a conceptual view illustrating antenna structures having different radiation directions.

Referring to (a) of FIG. 5A and (a) of FIG. 5B, a radiation direction of an antenna module disposed on the side area of the multi-layered PCB corresponds to a lateral (side) direction. In relation, an antenna implemented on a flexible substrate may be configured as radiation elements such as dipole/monopole antennas. That is, the antenna implemented on the flexible substrate may include end-fire antenna elements.

End-fire radiation may be implemented by an antenna that radiates a signal in a horizontal direction with respect to a substrate. The end-fire antenna may be implemented by a dipole/monopole antenna, a Yagi dipole antenna, a Vivaldi antenna, a SIW horn antenna, and the like. Here, the Yagi-dipole antenna and the Vivaldi antenna have horizontal polarization characteristics. Meanwhile, one of antenna modules disposed on the image display device disclosed herein needs a vertically polarized antenna. Therefore, there is a need of proposing an antenna structure capable of minimizing an exposed portion of an antenna while operating as a vertically polarized antenna.

Referring to (b) of FIG. 5A and (a) of FIG. 5B, a radiation direction of an antenna module disposed on the front area of the multi-layered PCB corresponds to a front direction. In relation, an antenna disposed on the AIP module may be configured as radiation elements such as patch antennas. That is, the antenna disposed on the AIP module may include broadside antenna elements that radiate in a broadside direction.

Figure 5C:
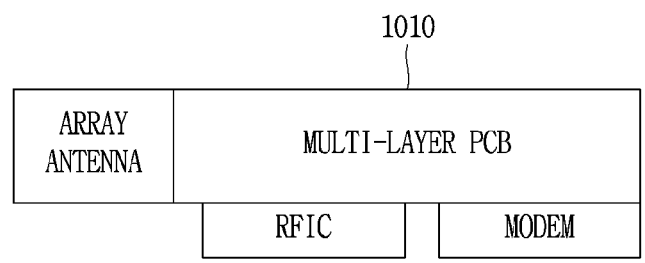
FIG. 5C illustrates coupling structures between a multi-layered substrate and a main substrate in accordance with embodiments.
Figure 5C:
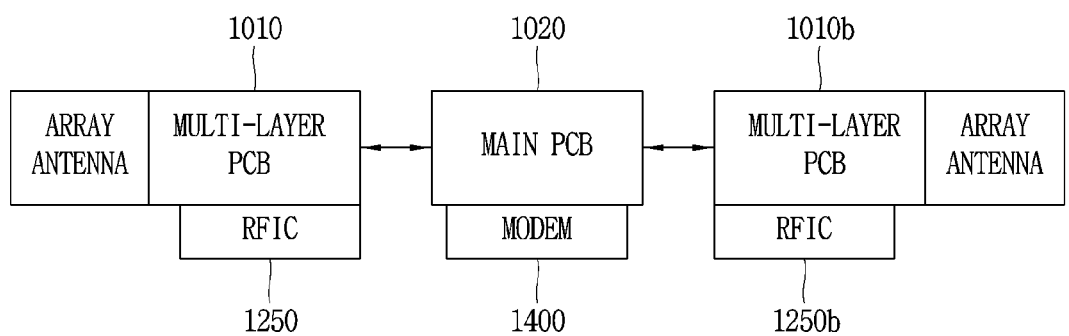

In the meantime, a multi-layered PCB having an array antenna disposed therein may be integrally formed with a main substrate or may be modularly coupled to the main substrate by a connector. In this regard, FIG. 5C illustrates coupling structures between a multi-layered substrate and a main substrate in accordance with embodiments. Referring to (a) of FIG. 5C, a structure in which the RFIC 1250 and the modem 1400 are integrally formed on the multi-layered PCB 1010 is illustrated. The modem 1400 may be referred to as a baseband processor 1400. Therefore, the multi-layered PCB 1010 may be integrally formed with the main substrate. The integral structure may be applied to a structure in which only one array antenna module is disposed in an electronic device.

On the other hand, the multi-layered PCB 1010 and the main substrate 1020 may be modularly coupled to each other by a connector. Referring to (b) of FIG. 5C, the multi-layered PCB 1010 may be interfaced with the main substrate 1020 through the connector. In this case, the RFIC 1250 may be disposed on the multi-layered PCB 1010 and the modem 1400 may be disposed on the main substrate 1020. Accordingly, the multi-layered PCB 1010 may be produced as a separate substrate from the main substrate 1020 and coupled to the main substrate 1020 through the connector.

The modular structure may be applied to a structure in which a plurality of array antenna modules are disposed in an electronic device. Referring to (b) of FIG. 5C, the multi-layered PCB 1010 and a second multi-layered PCB 1010*b* may be interfaced with the main substrate 1020 through connectors. The modem 1400 disposed on the main substrate 1020 may be electrically coupled to RFICs 1250 and 1250*b* disposed on the multi-layered PCB 1010 and the second multi-layered PCB 1010*b*.

Figure 6:
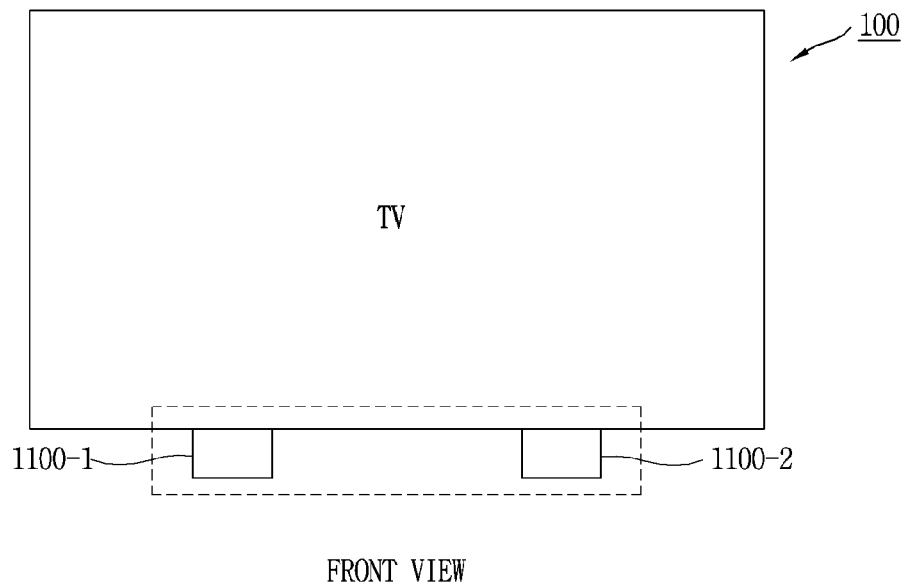
FIG. 6 is a conceptual view illustrating communications with a plurality of communication modules disposed on a lower portion of an image display device and another communication module disposed in a front direction of the image display device.
Figure 6:
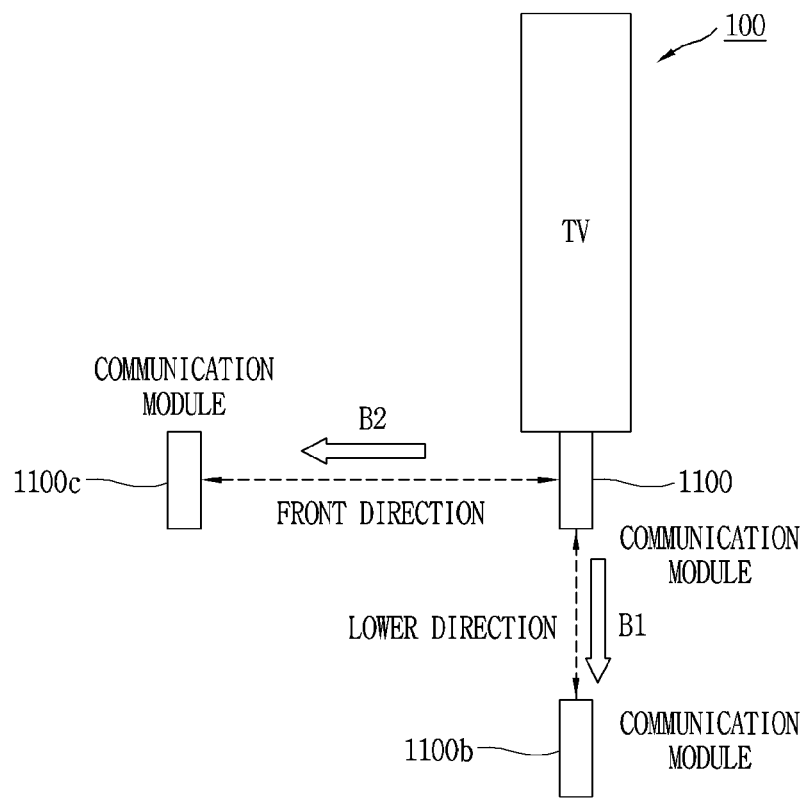

Meanwhile, when the AIP module is disposed beneath the electronic device such as the image display device, it is necessary to communicate with other communication modules disposed in a lower direction and a front direction. In this regard, FIG. 6 is a conceptual view illustrating a plurality of communication modules disposed on a lower portion of an image display device and communications carried out between the corresponding communication modules and another communication module disposed in a front direction of the image display device. Referring to (a) of FIG. 6, different communication modules 1100-1 and 1100-2 may be disposed on the lower portion of the image display device 100. Referring to (b) of FIG. 6, the image display device 100 may perform communication with a communication module 1100*b* disposed therebelow through an antenna module 1100. Also, the image display device 100 may perform communication with a second communication module 1100*c* disposed at the front thereof through the antenna module 1100. Here, the communication module 1100*b* may be a set-top box or AP that transfers AV data to the image display device 100 at high speed through the 802.11ay wireless interface, but is not limited thereto. Also, the second communication module 1100c may be an arbitrary electronic device that transmits and receives data at high speed to and from the image display device 100 through the 802.1 lay wireless interface.

Meanwhile, an antenna height may increase according to an RFIC driving circuit and a heat dissipation structure in the AIP module structure as illustrated in (a) of FIG. 5A. Also, the antenna height may increase in the AIP module structure as illustrated in (a) of FIG. 5A according to an antenna type used. On the other hand, the antenna module structure implemented on the side area of the multi-layered substrate as illustrated in (b) of FIG. 5A may be implemented as a low-profile type.

Figure 7A:
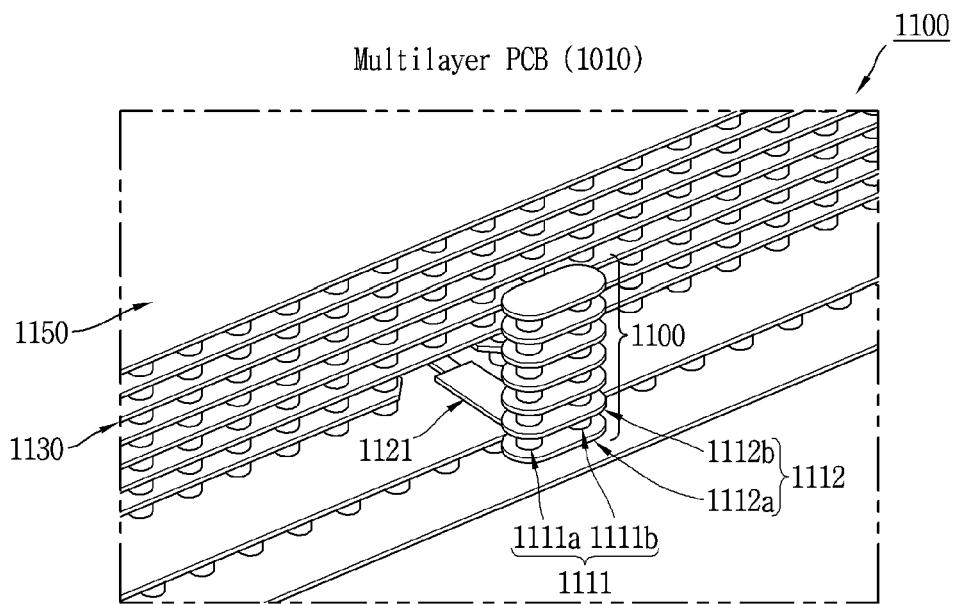
FIGS. 7A and 7B are perspective views illustrating an antenna module implemented as a multi-layered substrate according to embodiments.
Figure 7B:
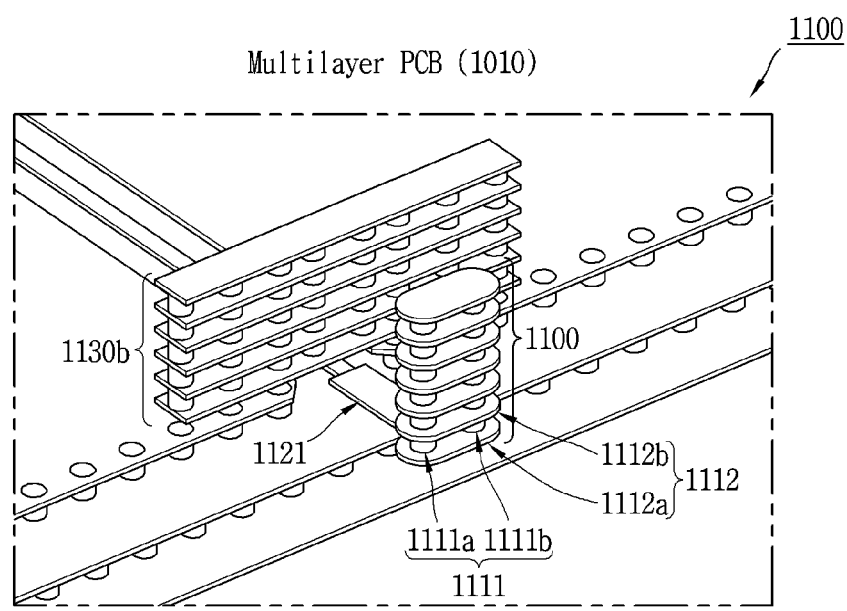
Figure 7C:
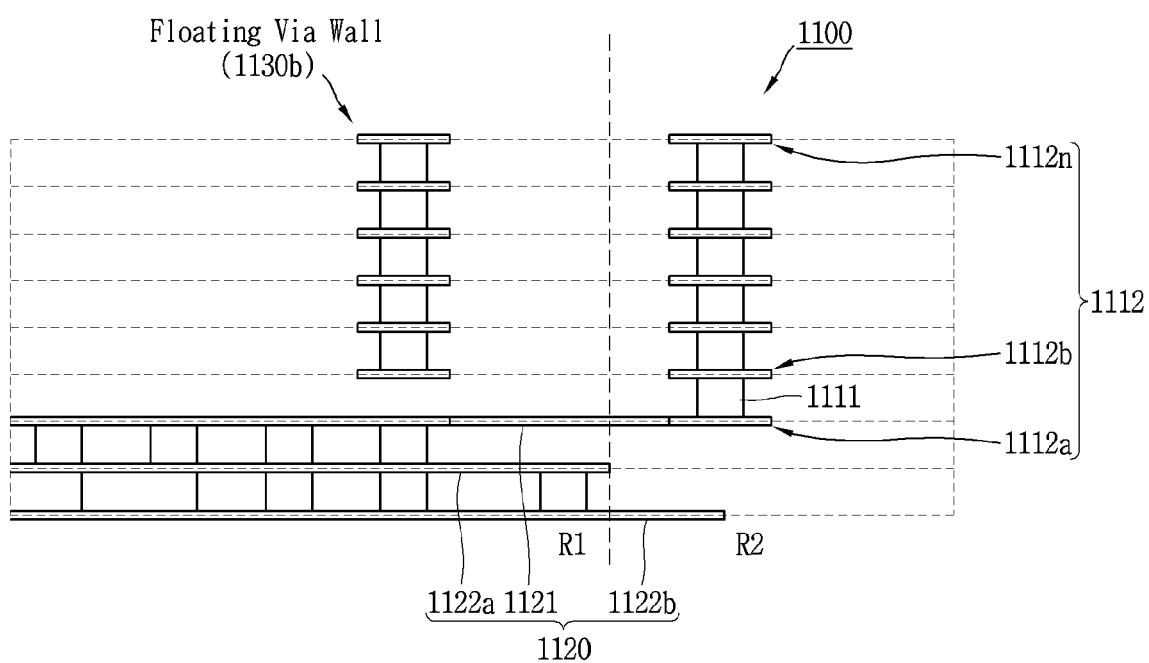
FIG. 7C is a lateral view of an antenna module including a via wall of FIG. 7B.

FIGS. 7A and 7B are perspective views illustrating an antenna module implemented as a multi-layered substrate according to embodiments. FIG. 7C is a lateral view of an antenna module including a via wall of FIG. 7B.

FIG. 7A illustrates a configuration in which a first type via wall is disposed adjacent to a monopole radiator configured by a plurality of connection lines. In detail, an embodiment in which a monopole antenna is disposed on an end of a PCB corresponding to a multi-layered substrate is illustrated. FIG. 7B illustrates a configuration in which a second type via wall is disposed adjacent to the monopole radiator configured by the plurality of connection lines. The first type via wall may be a configuration in which a vial wall is disposed on an entire area of the multi-layered substrate. The second type via wall may be a configuration in which a via wall is disposed only on a partial area inside a monopole radiator area of the area of the multi-layered substrate.

Referring to FIGS. 7A and 7C, the antenna module 1100 is configured such that a ground 1150, a feed part (or feeding unit) 1120, a via 1111, and a via pad 1112 are disposed on the multi-layered PCB 1010. Each layer of the multi-layered PCB may be configured as a substrate.

A monopole radiator 1110 may be configured by the vias 1111 and the via pads 1112. Two or more vias 1111 may be vertically connected to the multi-layered PCB 1010 through the via pads 1112. The two or more vias 1111 may be disposed at a gap of lambda/4 of an operating frequency to operate like one radiator.

Referring to FIGS. 7B and 7C, a structure of a floating via wall that a via wall is not connected to a ground is illustrated. On the other hand, a second type via wall 1130b may be a configuration in which a via wall is disposed only on a partial region inside a monopole radiator region of the region of the multi-layered substrate.

An antenna element disposed on the antenna module 1010 is not limited to the monopole antenna. When another type of antenna element is disposed or even when the monopole antenna is disposed, the via wall may be partially disposed depending on an application. For example, a patch antenna or a component such as a capacitor requiring for SMT may be disposed inside the PCB 1010 to be adjacent to the monopole radiator 1110. In this case, the via wall structure 1130 may not be formed long in a specific direction.

In the meantime, performance of an adjacent patch antenna or RF component may be deteriorated due to a flow of current that is generated when the via wall is connected to the ground. In this case, the via wall structure 1130 may be formed as a floating via wall without a connection to the ground, thereby avoiding deterioration of the performance of the patch antenna or RF component.

Figure 8A:
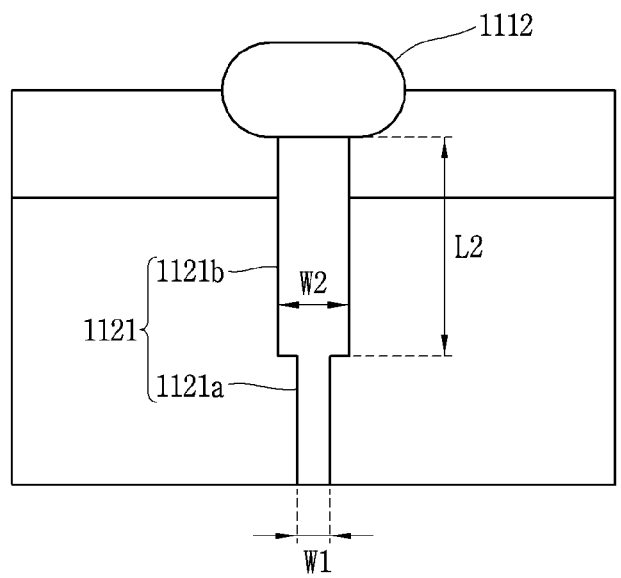
FIG. 8A illustrates a front view and a lateral view illustrating a configuration of a feed part.
Figure 8A:
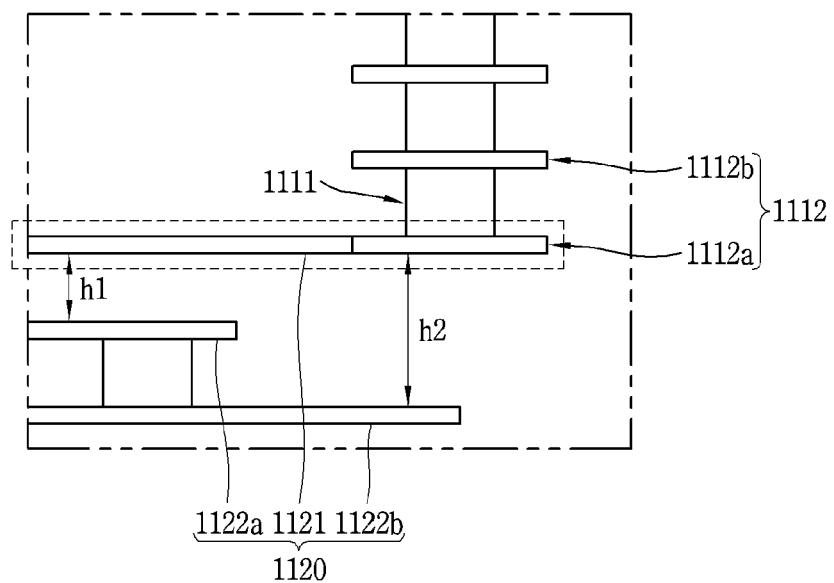
Figure 8B:
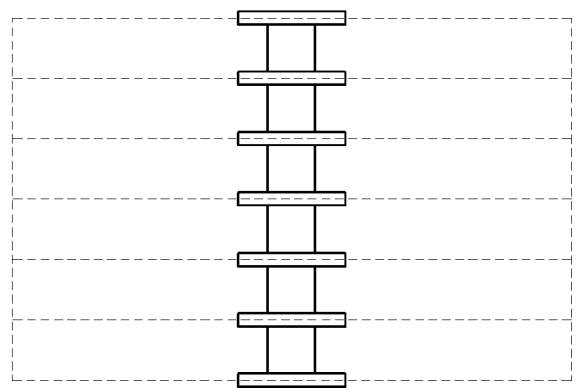
FIG. 8B illustrates a monopole antenna configuration configured by vertically connecting a plurality of via pads.
Figure 8B:
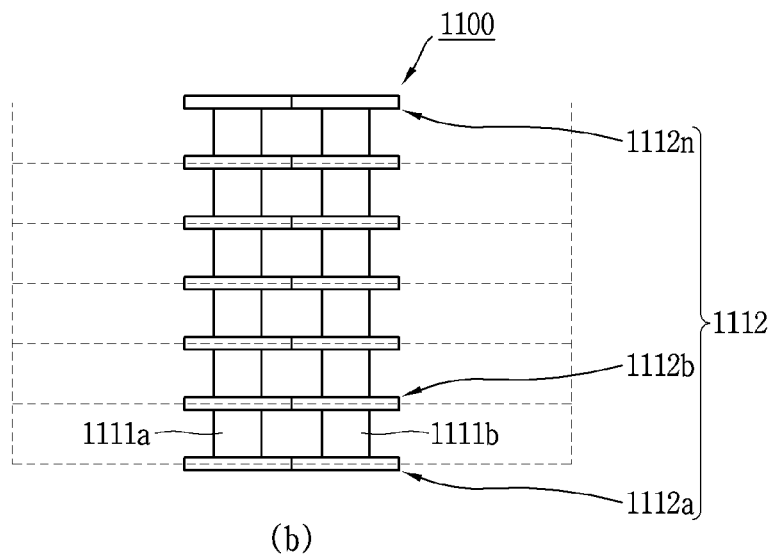

FIG. 8A illustrates a front view and a lateral view illustrating a configuration of a feed part. FIG. 8B illustrates a monopole antenna configuration configured by vertically connecting a plurality of via pads. (a) of FIG. 8B illustrates a configuration of a monopole antenna and (b) of FIG. 8B illustrates a configuration of a general monopole antenna, namely, a configuration of an LC tank monopole antenna, in which via pads are connected to a plurality of connection lines. (b) of FIG. 8B illustrates a via unit including via pads 1112 and a plurality of vias, namely, first and second connection lines 1111a and 1111b, and an equivalent circuit thereof.

Referring to FIG. 8A, a structure of a feed part 1120 for implementing a broadband impedance transformation is illustrated. Referring to (a) of FIG. 8A, a broadband impedance transformation unit is implemented by changing a width of a feed line (or feeding line) 1121. Referring to (a) of FIG. 8A, the broadband impedance transformation unit is implemented using a stepped ground.

In this regard, a first width W1 of a feed line 1121a formed on a first region R1 and a second width W2 of a feed line 1121b formed on a second region R2 may be differently set. The feed line 1121a formed on the first region R1 may be referred to as an impedance transformation unit 1121a or a first feed line 1121a. The feed line 1121b formed on the second region R2 may be referred to as a second feed line 1121b. Therefore, the feed line 1121 may be configured to include the first feed line 1121a and the second feed line 1121b. That is, the feed line 1121 may include the impedance transformation unit 121a and the second feed line 1121b.

Therefore, the feed line 1121 may be configured to have the first width W1 and the second width W2. The second width W2 of the feed line 1121, namely, the second feed line 1121b of the second region R2 adjacent to the radiator 1110 is implemented to have higher impedance than the first width W1. Also, the second feed line 1121b may have a length L2 that is set to be less than lambda/4 of an operating frequency, and may operate as an impedance transformation unit for impedance transformation. The operating frequency of the radiator 1110 within the antenna module may be changed to a low frequency band by the impedance transformation unit 1121a. This can reduce the size of the radiator 1110 within the antenna module. The first width W1 of the first feed line 1121a may be a transmission line having a characteristic impedance of 50 ohm.

As another implementing method, the ground may be stepped, as illustrated in (b) of FIG. 8A, to have a first height and a second height. In this regard, the feed part 1120 may include a feed line 1121, a first ground layer 1122a, and a second ground layer 1122b. The first ground layer 1122 may be configured to be disposed from a lower portion of the feed line 1121 up to the first region R1 in a horizontal direction. The second ground layer 1122b may be configured to be disposed from a lower portion of the first ground layer 1122a up to the second region R2, which is more adjacent to the radiator 1110 than the first region R1, in the horizontal direction.

In relation to the stepped ground, the first height h1 is set between the feed line 1121 and the first ground layer 1122a in the first region R1. On the other hand, the second height h2 is set between the feed line 1121 and the second ground layer 1122b in the second region R2. In this case, the stepped ground is formed such that the second height h2 from the feed line 1121 to the second ground layer 1122b in the second region R2 is higher than the first height h1 from the feed line 1121 to the first ground layer 1122a in the first region.

As aforementioned, the first height h1 of the first region R1 may be lower than the second height h2 of the second region R2. Since the height from the first ground layer 1122*a* and the feed line 1121 in the first region R1 is relatively low, the feed line 1121 may be formed to have low impedance. Since the height from the second ground layer 1122*b* and the feed line 1121 in the second region R2 is relatively high, the feed line 1121 may be formed to have high impedance. This can achieve impedance transformation even without a great change between the first width W1 and the second width W2 at the first region R1 and the second region R2. That is, low characteristic impedance of the feed line 1121, for example, 50 ohm may be transformed to high characteristic impedance of the radiator 1110.

Referring to (b) of FIG. 8B, an LC tank monopole antenna may be structurally configured by using two or more vias 1111*a* and 1111*b* and via pads 1112. Referring to (c) of FIG. 8B, the vias 1111*a* and 1111*b* and the via pads 1112 are structurally configured to have inductance and capacitance. Therefore, it is referred to as an LC tank, which can lower an antenna operating frequency, widen a bandwidth, so that the antenna can be miniaturized. In detail, when a current flows along the first and second connection lines 1111*a* and 1111*b* corresponding to the vias, the via unit 1110*v* may be equivalent to inductance L. On the other hand, as an electric field (e-field) is generated between the via pads 1112*a* and 1112*b*, the via unit 1110*v* may be equivalent to capacitance C.

Figure 9A:
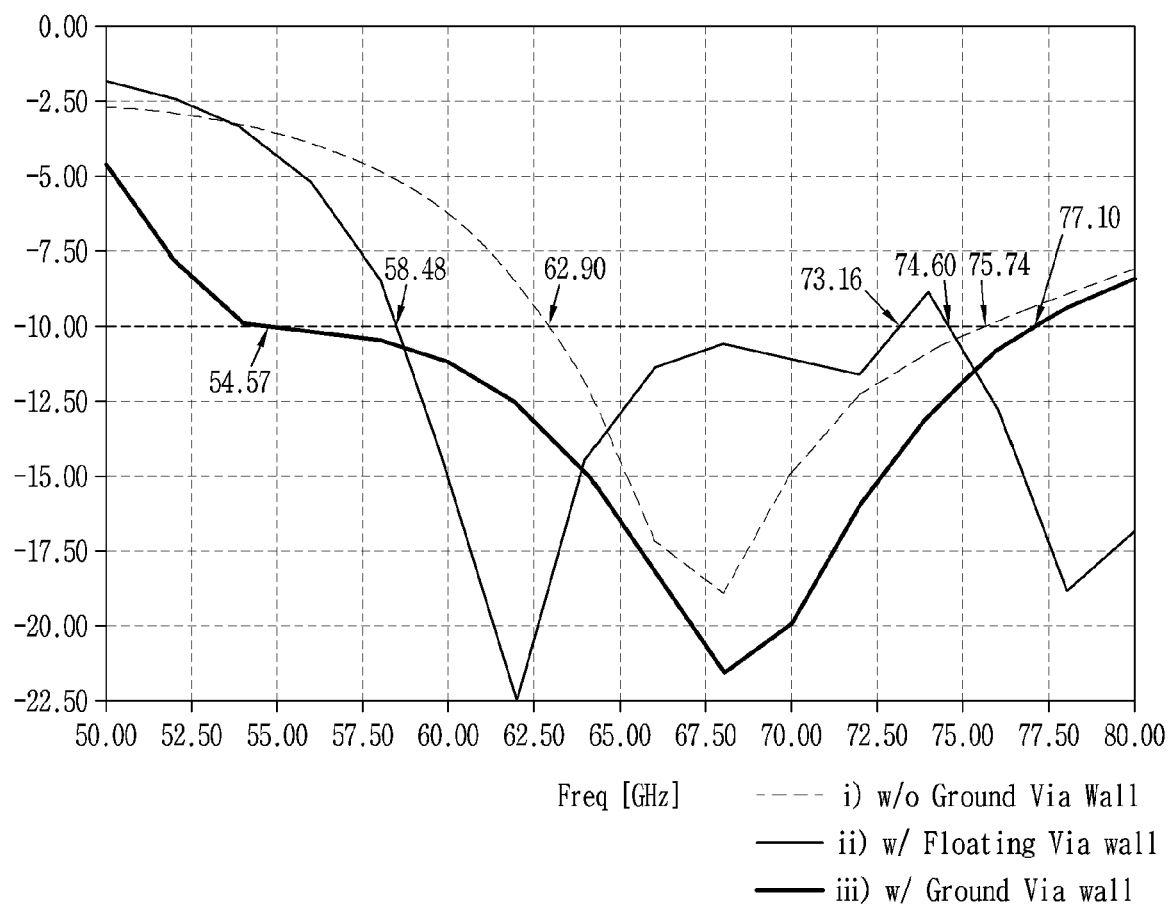
FIG. 9A illustrates reflection coefficient characteristics in a floating via wall structure and a grounded via wall structure when a via wall structure is not provided.
Figure 9B:
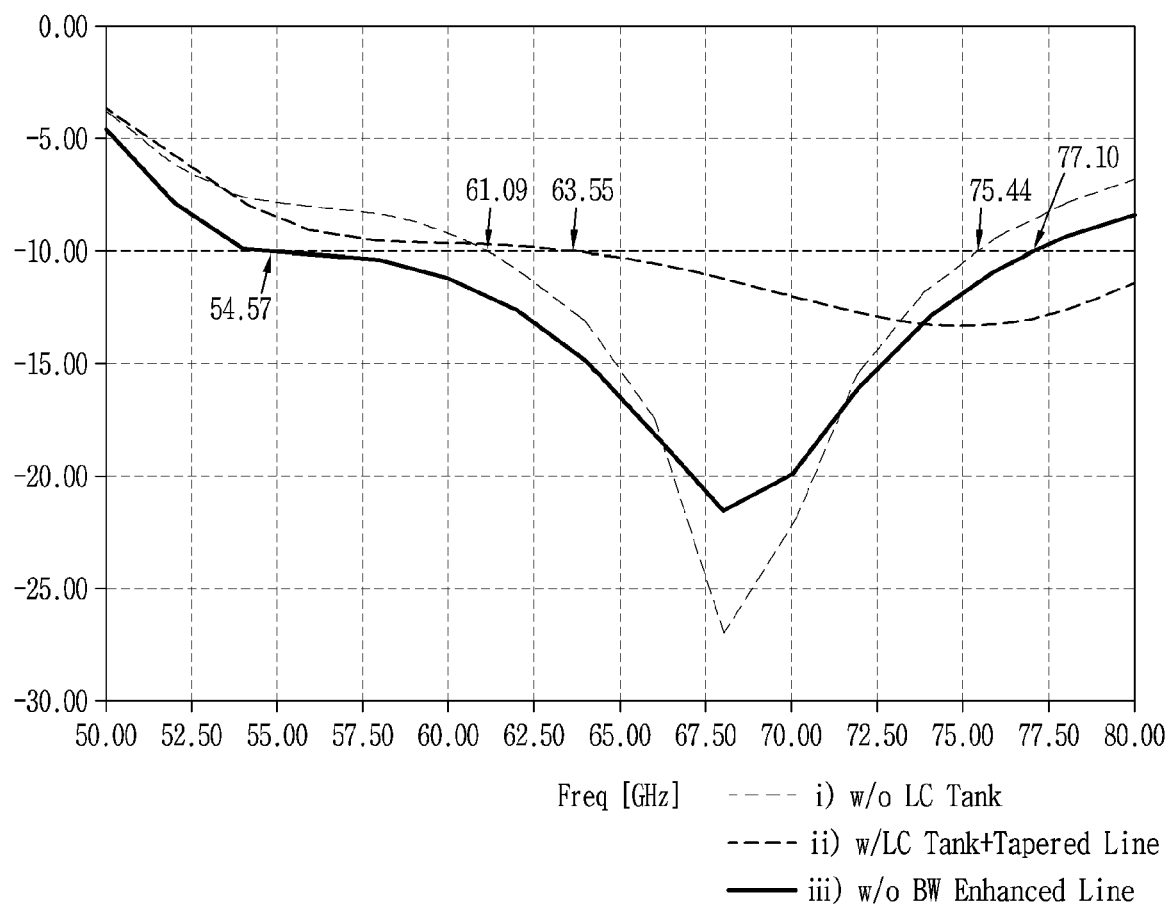
FIG. 9B illustrates reflection coefficient characteristics in a general monopole antenna, an LC tank monopole antenna, and a structure of LC tank monopole antenna+tapered feed line.

FIG. 9A illustrates reflection coefficient characteristics in a floating via wall structure and a grounded via wall structure when a via wall structure is not provided. FIG. 9B illustrates reflection coefficient characteristics in a general monopole antenna, an LC tank monopole antenna, and a structure of LC tank monopole antenna+tapered feed line.

Referring to FIG. 9A, under assumption that S11 is −10 dB or less, a satisfaction is achieved in resonant frequency characteristic of i) 63 to 76 GHz when there is no via wall, ii) 58 to 73 GHz for a floating via wall, and iii) 55 to 77 GHz for a grounded via wall. Therefore, the operating frequency of the antenna is lowered by the via wall. Accordingly, the operating frequency of the antenna can be lowered by the via wall without increasing an antenna size. For the floating via wall (ii), a dual resonance characteristic is observed, and a structure of the floating via wall can be optimized such that dual resonance frequencies are adjacent to each other.

FIG. 9B illustrates reflection coefficient characteristics in i) a general monopole structure without an LC tank, ii) an LC tank monopole structure, and iii) a structure of LC tank monopole antenna+tapered feed line. For the general monopole structure without the LC tank, an antenna operating frequency is in the range of 61 to 75 GHz. For the LC tank monopole structure, an antenna operating frequency is in the range of 64 to 80 GHz. For the structure of LC tank monopole antenna+tapered feed line, an antenna operating frequency is in the range of 55 to 77 GHz. Therefore, when applying the structure of LC tank monopole antenna+tapered feed line, the antenna operating frequency can be lowered, thereby achieving an effect of reducing an antenna size.

Referring to FIG. 9B, compared to the general monopole structure having an operating bandwidth of about 13 GHZ, the operating bandwidth of the structure of LC tank monopole antenna+tapered feed line is increased to about 22 GHz. On the other hand, compared to the general monopole structure that has a minimum operating frequency of about 62.9 GHZ, a minimum operating frequency of the structure of LC tank monopole antenna+tapered feed line is about 54.6 GHz. Accordingly, the antenna operating frequency can be lowered by about 8.3 GHz according to the embodiment of the present disclosure. This can result in providing an integral structure, in which an antenna is disposed inside a PCB, by miniaturizing the antenna without increasing the size of the antenna.

Hereinafter, an electronic device having antennas will be described with reference to FIGS. 2B, 3, and 7A to 8B. The electronic device may include an antenna module 1100 and a processor 1400. The processor 1400 of FIG. 3 may be implemented by the wireless interface 101 and the data processor 111 of FIG. 2B. Also, the processor 1400 of FIG. 3 may be implemented by the wireless interface 108 and the Internet protocol processor 107 of FIG. 2B.

The radiator 1110 may be configured such that metal patterns are stacked on different layers of a multi-layered substrate 1010. The feed part 1120 may include a feed line 1121 disposed on a specific layer of the radiator 1110 to be connected to the radiator 1110.

The processor 1400 may be operably connected to the antenna module 1100, may control a wireless device disposed adjacent to the electronic device to transmit or receive a wireless signal through the antenna module 1100. The processor 1400 may be disposed on the multi-layered substrate 1010, on which the antenna module 1100 is disposed, or may be disposed inside the electronic device to be separate from the antenna module 1100. In this regard, referring to (a) of FIG. 5C, the processor 1400 may be disposed on the multi-layered substrate 1010 together with the antenna module. On the other hand, referring to (b) of FIG. 5C, the processor 1400 may be disposed inside the electronic device to be separate from the antenna module. That is, the processor 1400 may be disposed on the main substrate 1020 to be separate from the antenna module.

The transceiver circuit 1250 of FIG. 5C may be disposed on the multi-layered substrate 1010, to control the antenna module 1100. The processor 1400 may be operably connected to the transceiver circuit 1250. The processor 1400 may control the transceiver circuit 1250 to transmit or receive a wireless signal to or from the wireless device, which is disposed adjacent to the electronic device, through the antenna module 1100.

The radiator 1110 may include a first pad 1112*a* connected to the feed line 1121, and a second pad 1112*b* disposed on a top of the first pad 1112*a*. The first pad 1112*a* and the second pad 1112*b* may be connected to each other by a first connection line 1111*a* and a second connection line 1111*b*. On the other hand, as illustrated in FIG. 8B, the plurality of pads may include first to nth pads 11112*a* to 1112*n*. In this regard, pads on adjacent layers among the plurality of pads 1112*a* to 1112*n* may be connected to each other by the first connection line 1111*a* and the second connection line 1111*b*.

Meanwhile, as aforementioned, an inductance component L may be generated by the first connection line 1111*a* and the second connection line 1111*b*. Also, a capacitance component C may be generated between the pads on the adjacent layers, for example, the first pad 1112*a* and the second pad 1112*b* disposed on the top of the first pad 1112*a*.

The first connection line 1111*a* may be configured to vertically connect a first end portion of the first pad 1112*a* and a first end portion of the second pad 1112*b*, thereby generating a first inductance component L1. The second connection line 1111*b* may be configured to vertically connect a second end portion of the first pad 1112*a* and a second end portion of the second pad 1112*b*, thereby generating a second inductance component L2. Also, the first pad 112*a* having a first area and the second pad 1112*b* having a second area may be spaced apart from each other by a predetermined gap, thereby generating the capacitance component C. Accordingly, the radiator 1110 may be implemented to have a broadband characteristic by the first and second inductance components L1 and L2 and the capacitance component C.

The feed part 1120 may include a feed line 1121, and a first ground layer 1122*a* that is disposed below the first feed line 1121 in the horizontal direction up to the first region R1. The feed part 1120 may include a second ground layer 1122*b* that is disposed below the first ground layer 1122*a* in the horizontal direction up to the second region R2, which is more adjacent to the radiator 1110 than the first region R1. The first width W1 of the feed line 1121 formed in the first region R1 and the second width W2 of the feed line 1121 formed in the second region R2 may be differently set.

The feed part 1120 may be configured such that the first height h1 from the freed line 1121 to the first ground layer 1122*a* at the first region R1 is higher than the second height h2 from the feed line 1121 to the second ground layer 1122*b* at the second region R2. Therefore, the feed part 1122 may be formed as the stepped ground in which the first height h1 is higher than the second height h2.

Figure 10A:
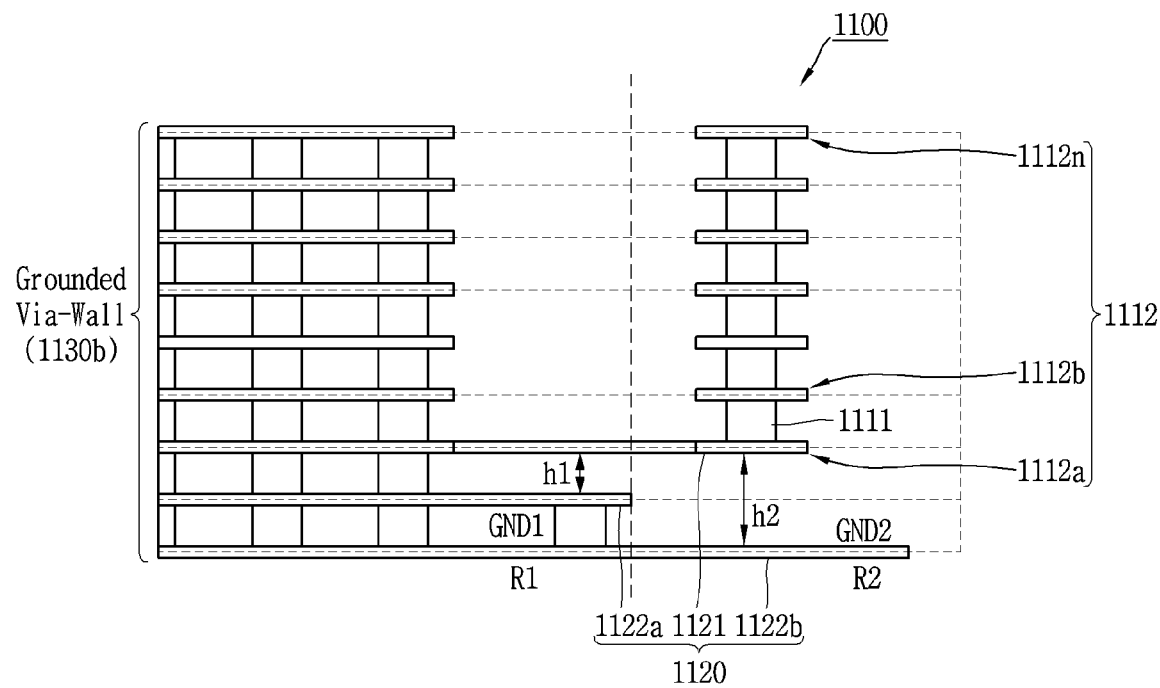
FIGS. 10A and 10B illustrate a configuration in which a feed part is formed in a microstrip line structure or strip line structure in a structure of LC tank antenna+via wall according to an embodiment.
Figure 10B:
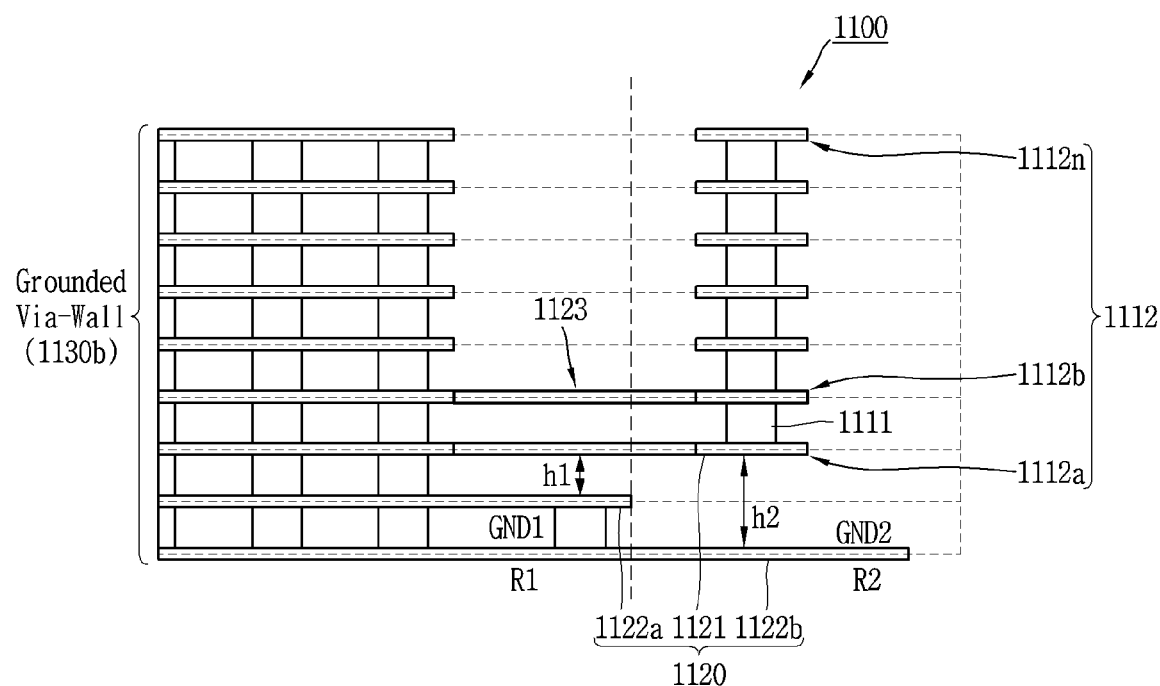

Meanwhile, the feed part 1120 may be formed in a strip line structure having a ground even on an upper portion, in addition to a microstrip line structure. In this regard, FIGS. 10A and 10B illustrate a configuration in which a feed part is formed in a microstrip line structure or strip line structure in a structure of LC tank antenna+via wall according to an embodiment. FIG. 10A illustrates that the feed part is configured as the microstrip line in the structure of LC tank antenna+via wall. On the other hand, FIG. 10B illustrates that the feed part is configured as the strip line in the structure of LC tank antenna+via wall. Referring to FIG. 10B, the feed part 1120 may further include an upper ground layer 1123 disposed above the feed line 1121.

Referring to FIGS. 10A and 10B, the antenna module may further include a via wall structure 1130 that is disposed to be spaced apart a predetermined gap from the radiator 1110 in the horizontal direction, for example, in an inward direction of the multi-layered substrate 1010. The via wall structure 1130 may be disposed to include a plurality of vertical vias vertically connected to one another between a plurality of pads at a plurality of points. The via wall structure 1130 may be configured as a grounded via wall electrically connected to the ground of the multi-layer substrate 1010*a*. According to another embodiment, the via wall structure 1130 may be configured as a floating via wall that is not electrically connected to the ground of the multi-layered substrate 1010*a*.

Meanwhile, the feed line 1121 may be configured as a strip line by the ground layer 1123 at the first region R1 and the second region R2. The feed line 1121 may be configured as a strip line by an upper ground layer 1123 and a first ground layer 1122*a* at the first region R1. The feed line 1121 may be configured as a first type of strip line by the upper ground layer 1123 and the first ground layer 1122*a* at the first region R1. The first type of strip line is formed such that a height from the feed line 1121 to the first ground layer 1122*a* is set to a first height h1. The first type of strip line is formed such that a height from the feed line 1121 to the upper ground layer 1123 is set to a third height h3.

The feed line 1121 may be configured as a strip line by the upper ground layer 1123 and the second ground layer 1122*b* at the second region R2. The feed line 1121 may be configured as a second type of strip line by the upper ground layer 1123 and the second ground layer 1122*b* at the second region R2. The second type of strip line is formed such that a height from the feed line 1121 to the second ground layer 1122*b* is set to a second height h2. The second type of strip line is formed such that a height from the feed line 1121 to the upper ground layer 1123 is set to the third height h3.

As the type of the strip line is changed from the first region R1 to the second region R2, the impedance transformation from lower characteristic impedance to high characteristic impedance is allowed by the impedance transformation unit. Also, by the feed line 1121 configured as the strip line, a feed loss can be reduced at a high frequency band such as the mmWave band.

Hereinafter, relationship between the width W1, W2 of the feed line 1121 and the height h1, h2 of the stepped ground will be described with reference to (a) of FIG. 8A and FIG. 10A. First of all, the relationship between the first width W1 and the first height h1 of the impedance transformation unit 1121*a* and the relationship between the width W2 and the second height h2 of the second feed line 1121*b* will be described.

In order for the first feed line 1121*a* to operate as an impedance transformation unit 1121*a* that performs impedance transformation between the radiator 1110 and the second feed line 1121*b*, the width W1, W2 and the height h1, h2 of the stepped ground satisfy Equation 1 and Equation 2 as follows.

$$Z_1 = \frac{60}{\sqrt{\varepsilon_r}}\left(\frac{8h_1}{w} + \frac{w}{4h_1}\right), Z_2 = \frac{60}{\sqrt{\varepsilon_r}}\left(\frac{8h_2}{w} + \frac{w}{4h_2}\right) \quad \text{[Equation 1]}$$

$$h_1 < h_2, (50 \text{ ohm} \leq Z_1 \leq Z_2) \quad \text{[Equation 2]}$$

In Equation 1, Z1 and Z2 denote characteristic impedances of the first feed line 1121*a* and the second feed line 1121*b*. In Equation 1, w of the first feed line 1121*a* having the first characteristic impedance Z1 corresponds to the first width W1. w of the second feed line 1121*b* having the second characteristic impedance Z2 corresponds to the second width W2.

According to an embodiment, when w=0.1 mm, $h_1$=0.1 mm, $h_2$=0.2 mm, and $\varepsilon_r$=3.3, it is determined that $z_1$=272 ohm and $Z_2$=532 ohm. Here, $\varepsilon_r$ denotes effective permittivity of the second feed line 1121 at the first region R1 or the second region R2 where the feed line 1121 is disposed. Therefore, while satisfying Equation 1 and Equation 2, the first feed line 1121*a* operates as the impedance transformation unit 1121*a* that performs the impedance transformation between the radiator 1110 and the second feed line 1121*b*.

The relationship between the width W1, W2 of the feed line 1121 and the height h1, h2 of the stepped ground according to Equations 1 and 2 as aforementioned may be applied to the microstrip line configuration as illustrated in FIG. 10A. The relationship between the width W1, W2 of the feed line 1121 and the height $h_1$, $h_2$ of the stepped ground according to Equations 1 and 2 may be applied to a strip line configuration as illustrated in FIG. 10B. In case of the strip line configuration, $h_1$ and $h_2$ of Equation 1 may be replaced with $h_1+h_3$ and $h_2+h_3$ by considering the height of each strip line. In relation, proportional factors 60, 8*h*, and 4*h* in Equation 1 may be changed by reflecting the strip line configuration.

Figure 11A:
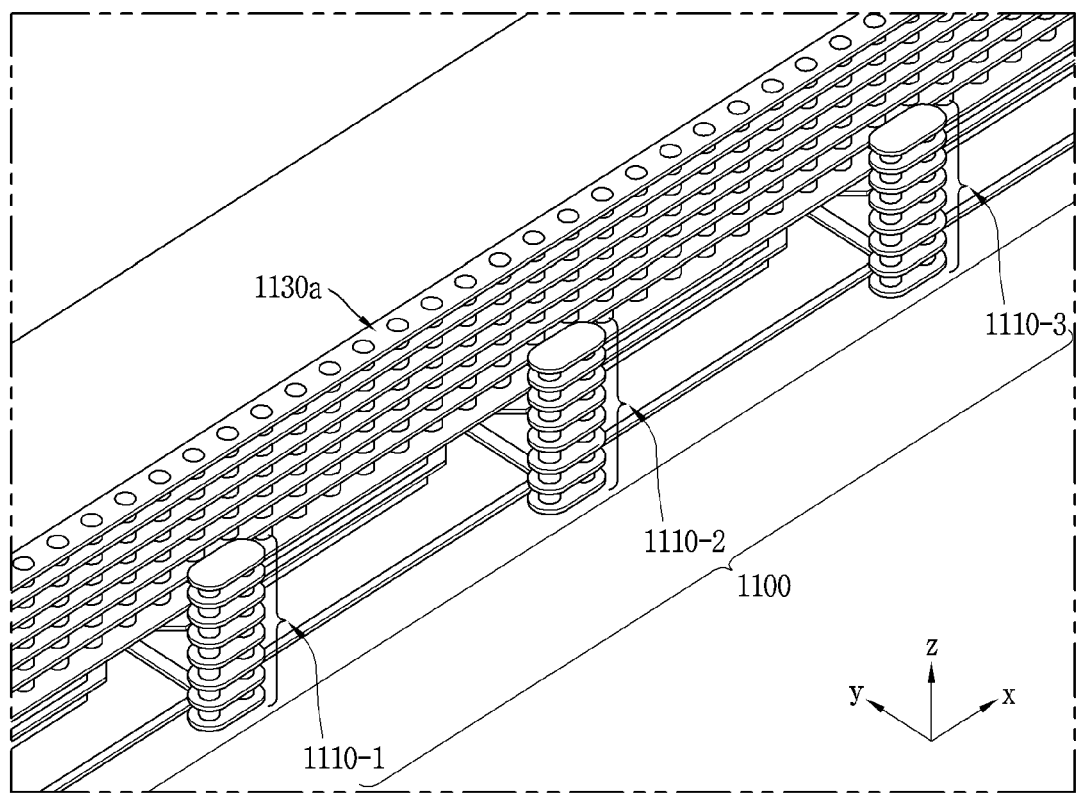
FIGS. 11A and 11B illustrate a configuration in which first and second type via wall structures are disposed at an inner side of a circuit board on which an array antenna is disposed.
Figure 11B:
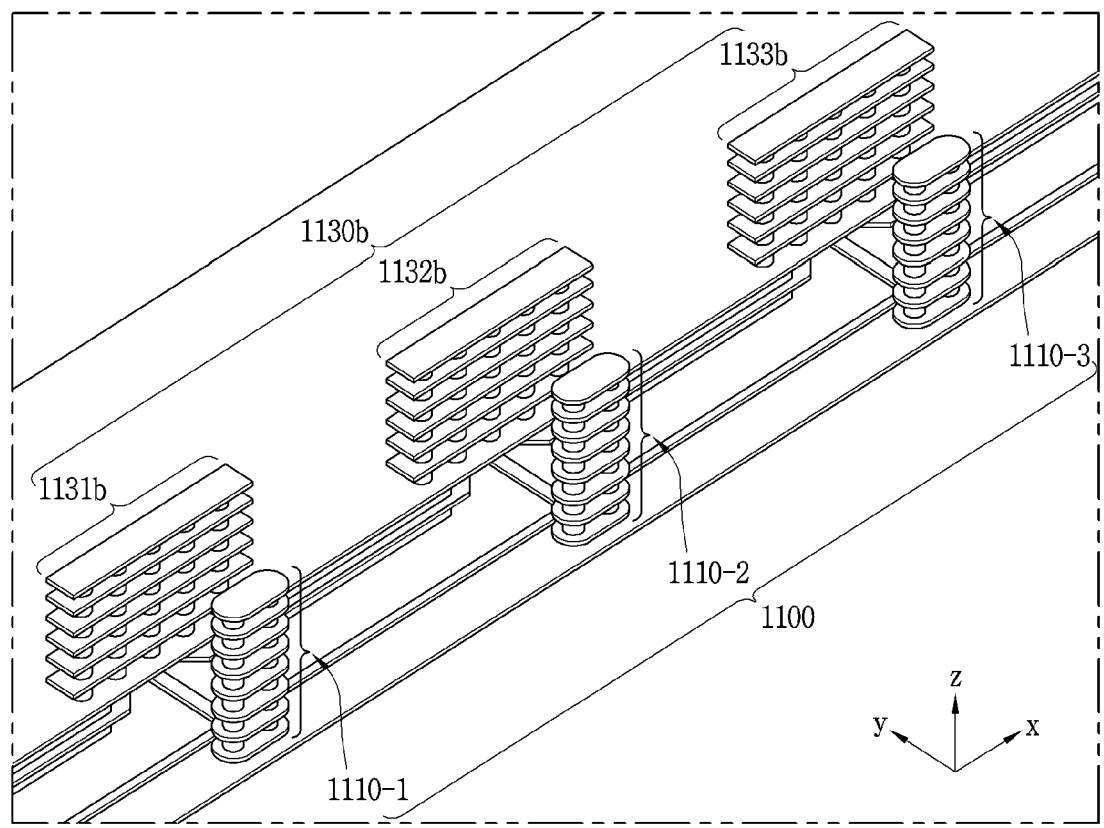

On the other hand, in the radiator 1110 according to the present disclosure, a plurality of elements may be disposed at predetermined gaps to configure an array antenna 1100 as illustrated in FIGS. 11A and 11B. In this regard, FIGS. 11A and 11B illustrate a configuration in which first and second type via wall structures are disposed at an inner side of a circuit board on which an array antenna is disposed. FIG. 11A illustrates a configuration in which a first type via wall structure 1130a is disposed at the inner side of the circuit board where the array antenna 1100 is disposed. FIG. 11B illustrates a configuration in which a second type via wall structure 1130b is disposed at the inner side of the circuit board where the array antenna 1100 is disposed.

Referring to FIGS. 11A and 11B, an embodiment in which the radiators 1110 in the form of LC tank monopole antenna are disposed at a predetermined gap to configure the array antenna 1100 is illustrated. The disposition gap between the radiators 1110 as the monopole antennas may be set to a value within a predetermined range from lambda/2 of an operating frequency, or may be set to be smaller or greater than the value depending on an application. When the disposition gap between the radiators 1110 is set to a value greater than lambda/2, an antenna gain is increased and interference between antennas is decreased but an antenna disposition space is expanded. On the other hand, when the disposition gap between the radiators 1110 is set to a value greater than or equal to the lambda, a grating lobe phenomenon that two or more main beams are generated may occur. Therefore, the disposition gap may be set in the range from the lambda/2 to the lambda of the operating frequency. When the disposition gap between the radiators 1110 is greatly reduced to be smaller than the lambda/2, the antenna disposition space is reduced to miniaturize the antenna, but the antenna gain is reduced and the interference between antennas is increased.

Referring to FIGS. 11A and 11B, the first and second type via wall structures 1130a and 1130b may be connected to each other or partially disconnected to be independently disposed. Referring to FIG. 11A, the first type via wall structures 1130a may be connected into one via wall to be disposed at the inner side of the array antenna 1100 with a plurality of radiators 1110-1 to 1110-3. Referring to FIG. 11B, the second type via wall structures 1130b may be partially disconnected to be independently disposed. Therefore, the second type via wall structures 1131b to 1133b may be disposed at the inner side of the array antenna 1100 with the plurality of radiators 1110-1 to 1110-3.

The number of elements of the array antenna may be two, three, four, and the like as illustrated, but is not limited thereto. For example, the number of elements of the array antenna may be expanded to two, four, eight, sixteen, and the like. Therefore, the array antenna may be configured as 1×2, 1×3, 1×4, 1×5, . . . , 1×8 array antenna.

Referring to FIGS. 11A and 11B, the antenna module may further include the via wall structure 1130a, 1130b that is disposed to be spaced apart a predetermined gap from the radiator 1110 in the horizontal direction, for example, in an inward direction of the multi-layered substrate 1010. The via wall structure 1130a, 1130b may be disposed to include a plurality of vertical vias which are vertically connected to one another between a plurality of pads at a plurality of points.

Here, the via wall structure 1130a, 1130b may include a plurality of vertical vias disposed in a first axial (x-axial) direction. Accordingly, the via wall structure 1130a, 1130b may be configured as a one-dimensional via wall. Depending on an application, the via wall structure 1130a, 1130b may include a plurality of vertical vias disposed in the first axial (x-axial) direction and a second (y-axial) direction, as illustrated in FIGS. 10A and 10B. Accordingly, the via wall structure 1130a, 1130b may be configured as a two-dimensional via wall. The via wall structure 1130a, 1130b may be configured as a floating via wall that is not electrically connected to the ground of the multi-layered substrate 1010.

In FIGS. 11A and 11B, the number of radiators 1110-1 to 1110-3 is three, but is not limited thereto. The number may vary depending on an application. The number of the plurality of radiators within the array antenna 1100 may be determined as an even number, such as 2, 4, 6, 8, 10, 12 or 16 by considering coupling of feed lines. However, it is not limited thereto, but the number may alternatively be determined as an odd number, such as 3, 5, 7, 9, or 11.

Meanwhile, the first and second type via wall structures 1130a and 1130b may be connected to at least one of ground layers through vias, to form a grounded via wall structure. Or, the first and second type via wall structures 1130a and 1130b may be formed in a floating via wall structure, which is floated without being electrically connected to the ground layers.

An LC tank monopole antenna structure according to the present disclosure may change in various ways depending applications. On the other hand, the LC tank monopole antenna structure can reduce an antenna height so as to miniaturize the antenna, compared to the general monopole antenna structure. Especially, when the monopole antenna structure is disposed within a substrate having a low height, the reduction of the antenna height is an important issue.

Figure 12:
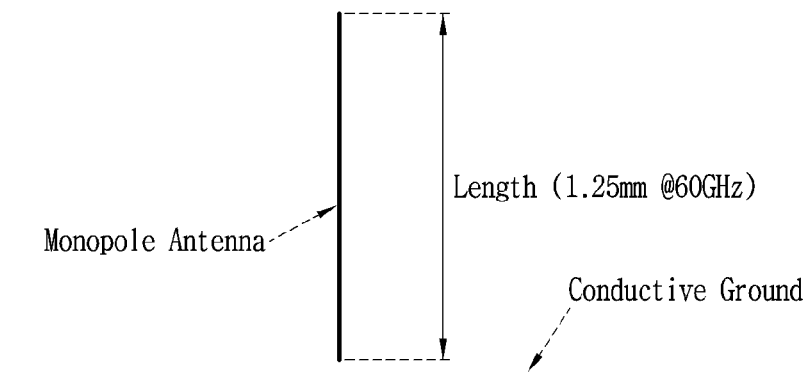
FIG. 12 compares a general monopole antenna structure and an LC tank monopole antenna in an mmWave band.
Figure 12:
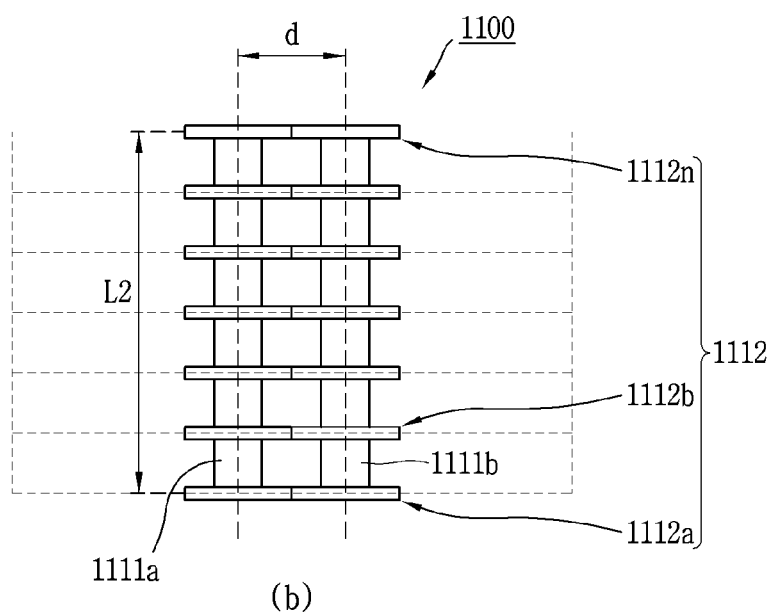

In this regard, FIG. 12 compares a general monopole antenna structure and an LC tank monopole antenna in an mmWave band. (a) of FIG. 12 illustrates the general monopole antenna structure at a band of 60 GHz. Referring to (a) of FIG. 12, the monopole antenna may be formed to have a height of about 1.25 mm. On the other hand, (b) of FIG. 12 illustrates the LC tank monopole antenna structure at a band of 60 GHz. Referring to (b) of FIG. 12, the LC tank monopole antenna 1110 may be formed to have a height of about 0.8 mm. As one example, a distance d between the first connection line 1111a and the second connection line 1111b may be set to about 0.25 mm. The height of the LC tank monopole antenna 1110 that is formed on the plurality of layers by the plurality of pads 1112a to 1112n and the plurality of connection lines 1111a and 1111b may be about 0.83 mm.

In relation, lengths Length$_1$ and Lenght$_2$ of the general monopole antenna structure and the LC tank monopole antenna structure are compared in Equation 3 and Equation 4.

[Equation 3]
$$\text{Length}_1 = \frac{c}{4f_0} \quad (c:\text{ velocity of light},\ f_0:\text{ resonance frequency})$$

[Equation 4]
$$\text{Length}_2 = \frac{c}{4f_0 C_{ap}} \quad (c:\text{ velocity of light},\ f_0:\text{ resonance frequency})$$

When Equation 3 is applied to the general monopole structure of (a) of FIG. 12, Length$_1$=1.25 mm at $f_0$=60 GHz. On the other hand, Equation 4 may be applied to the LC tank monopole structure according to the present disclosure of (b) of FIG. 12. In this regard, a capacitance value Cap generated by the first connection line 1111a and the second connection line 1111b of (b) of FIG. 12 may be determined, as expressed by Equation 5 below.

[Equation 5]
$$C_{ap} = \varepsilon_{reff} \frac{A}{L} \quad (A: \text{area}, \ L: \text{monopole length}, \ \varepsilon_{reff}: \text{effective permitivity})$$

In relation to Equation 5, the capacitance value Cap may be determined by an area A formed by the plurality of connection lines 1111a and 1111b, and accordingly, the length L2 of the LC tank monopole may be determined. As one example, referring to Equation 4, Equation 5, and (b) of FIG. 12, in a linear connection structure, the area A may be an area formed by the first connection line 1111a and the second connection line 1111b. That is, the area A may be an area formed on the via pads when centers of vias are connected.

Referring to (b) of FIG. 12, it is determined that capacitance value Cap=0.66 when A=0.25 mm, L=0.83 mm and $\varepsilon_{r,eff}$=2.2. Accordingly, as the area A increases, the capacitance value Cap may be increased and the monopole length L2 of the LC tank monopole structure may be decreased. Therefore, the monopole length L2 is reduced, compared to the monopole length L1 of the general monopole structure, by the capacitance value Cap formed by the LC tank monopole structure. However, when the area A is increased by a threshold value or more, a capacitor effect may not be generated by the LC tank monopole structure. Accordingly, it is necessary to increase the area A by forming an additional connection line in addition to the first connection line 1111a and the second connection line 1111b to operate as a capacitor.

Figure 13:
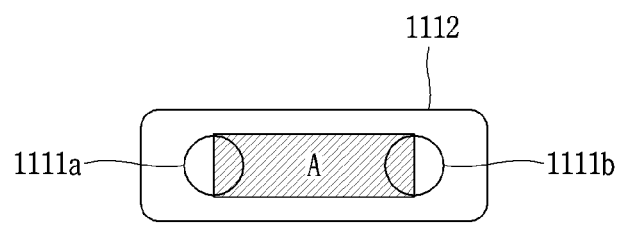
FIG. 13 is a conceptual view illustrating an effective area formed by a plurality of connection lines in an LC tank monopole structure according to various embodiments.
Figure 13:
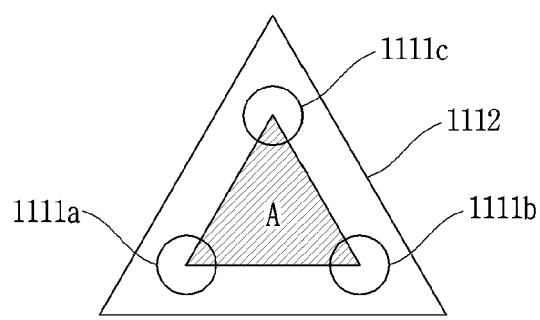
Figure 13:
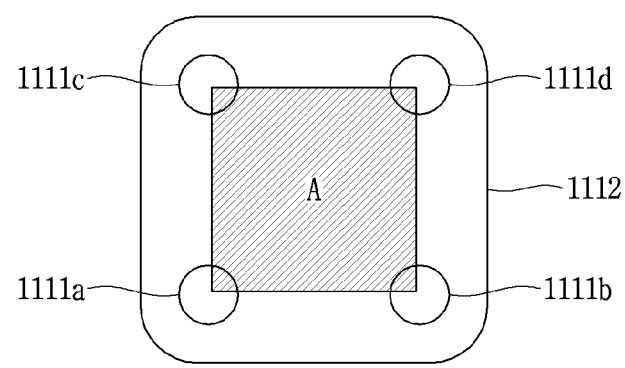

In this regard, FIG. 13 is a conceptual view illustrating an effective area formed by a plurality of connection lines in an LC tank monopole structure according to various embodiments.

(a) of FIG. 13 illustrates a linear connection structure formed by the first connection line 1111a and the second connection line 1111b. (b) of FIG. 13 illustrates a triangular connection structure formed by the first connection line 1111a to a third connection line 1111c. (c) of FIG. 13 illustrates a rectangular connection structure formed by the first connection line 1111a to a fourth connection line 1111d. In the meantime, the LC tank monopole structure by the plurality of connection lines between adjacent pads according to the present disclosure may be represented by an arbitrary polygonal connection structure. To optimize the performance of the LC tank monopole structure, it may alternatively be represented by a combination of different types of connection structures for each adjacent layer.

Referring to FIGS. 10A and 10B, and (b) of FIG. 13, the first pad 1112a and the second pad 1112b may be configured to be connected by the first connection line 1111a, the second connection line 1111b, and the third connection line 1111c. The third connection line 1111c may be disposed between the first connection line 1111a and the second connection line 1111b.

The third connection line 1111c may be disposed between the first connection line 1111a and the second connection line 1111b on the linear connection structure as illustrated in (a) of FIG. 13, namely, substantially on the same line as the first connection line 1111a and the second connection line 1111b. Or, the third connection line 1111c may alternatively be disposed to form the triangular connection structure as illustrated in (b) of FIG. 13.

To this end, as illustrated in (b) of FIG. 13, the first connection line 1111a and the second connection line 1111b may be disposed on the first axis. The third connection line 1111c is disposed between the first connection line 1111a and the second connection line 1111b on the first axis (x axis). On the other hand, the third connection line 1111c may be disposed at a point that is more offset than the first and second connection lines 1111a and 1111b on the second axis (y axis) perpendicular to the first axis.

Referring to FIGS. 10A and 10B, and (c) of FIG. 13, the first pad 1112a and the second pad 1112b may be connected by the first connection line 1111a, the second connection line 1111b, the third connection line 1111c, and the fourth connection line 1111d. Depending on an application, the first pad 1112a and the second pad 1112b may be connected to each other by the first connection line 1111a, the second connection line 1111b, and the third connection line 1111c. Or, the first pad 1112a and the second pad 1112b may be connected to each other by the first connection line 1111a, the second connection line 1111b, and the fourth connection line 1111d.

To this end, as illustrated in (c) of FIG. 13, the first pad 1112a and the second pad 1112b may be connected by the first connection line 1111a and the second connection line 1111b disposed on the first axis. The first pad 1112a and the second pad 1112b may be connected to each other by the first connection line 1111a and the third connection line 1111c on the second axis perpendicular to the first axis. Or, the first pad 1112a and the second pad 1112b may be connected to each other by the second connection line 1111b and the fourth connection line 1111d on the second axis perpendicular to the first axis. To form the rectangular connection structure, the first pad 1112a and the second pad 1112b may be connected to each other by the first connection line 1111a and the third connection line 1111c and by the second connection line 1111b and the fourth connection line 1111d on the second axis perpendicular to the first axis.

According to the present disclosure, the antenna module 1100, similar to the monopole radiator 1110, may further include a second type antenna, which radiates a signal to an upper area of the multi-layered substrate 1010, in addition to the first type antenna radiating to the side area of the multi-layered substrate 1010. In this regard, the first type antenna and the second type antenna may be configured as antennas having the same polarization. Or, the first type antenna and the second type antenna may be configured as antennas having different polarizations. As one example, the first type antenna may operate as a vertically polarized antenna and the second type antenna may operate as a horizontally polarized antenna.

Figure 14A:
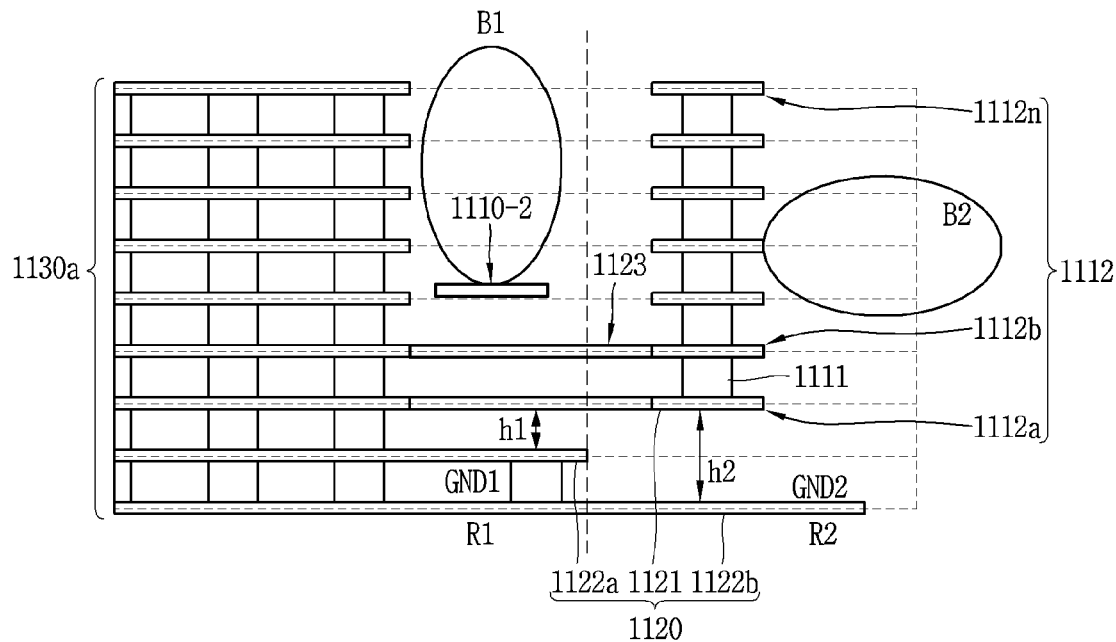
FIGS. 14A and 14B illustrate an antenna module disposed on a multi-layered substrate having a first type antenna and a second type antenna.
Figure 14B:
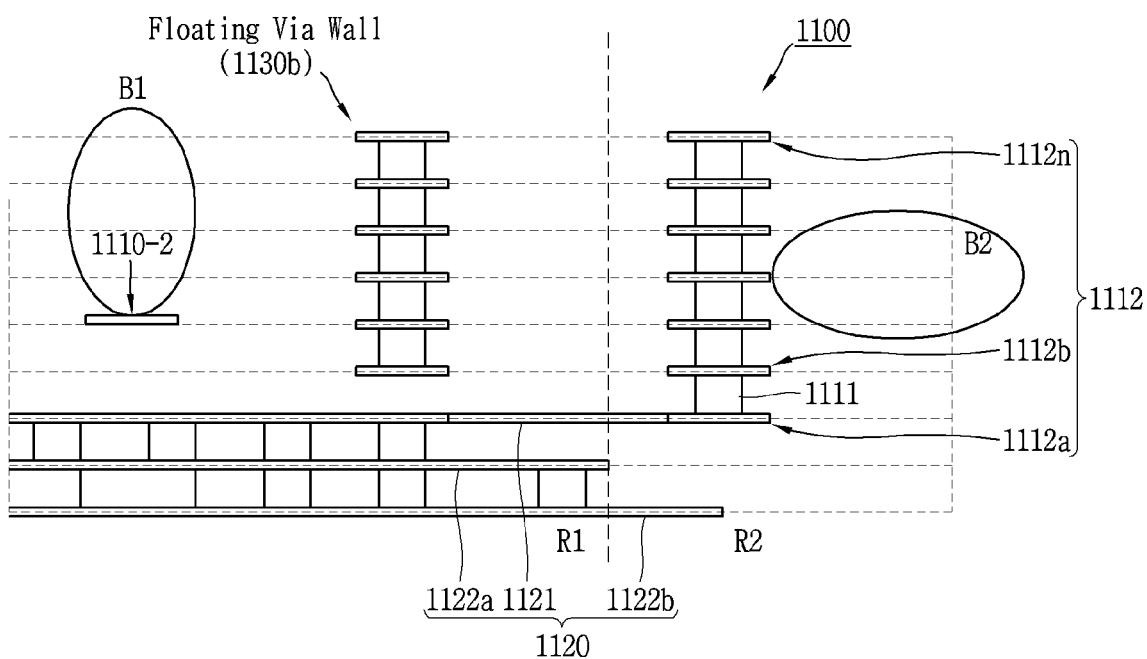

FIGS. 14A and 14B illustrate an antenna module disposed on a multi-layered substrate having a first type antenna and a second type antenna. In detail, FIG. 14A illustrates a configuration in which the second type antenna is disposed between the monopole antenna and the grounded via wall. FIG. 14B illustrates a configuration in which the second type antenna is disposed at an inner side of the grounded via wall.

Referring to FIG. 14A, the via wall may be configured as the grounded via wall 1130a but is not limited thereto. A patch antenna 1110-2 corresponding to the second type antenna may be disposed between the via wall 1112 corresponding to the monopole antenna and the grounded via wall 1130a.

Referring to FIG. 14B, the via wall may be configured as the floating via wall 1130b but is not limited thereto. The patch antenna 1110-2 corresponding to the second type antenna may be disposed between the via wall 1112 corresponding to the monopole antenna and the floating via wall 1130b. In other words, the patch antenna 1110-2 may be disposed on the multi-layered substrate more inward than the floating via wall 1130b.

Referring to FIGS. 7A to 14B, the radiator 1110 operates as the vertically polarized antenna by the first connection line 1111a and the second connection line 1111b that vertically connect the first pad 1112a and the second pad 1112b. The antenna module 1100 may further include the patch antenna 1110-2 that operates as the horizontally polarized antenna in addition to the vertically polarized antenna. The patch antenna 1110-2 may be disposed on an upper portion of the upper ground layer 1123 of FIG. 10B, but is not limited thereto. As another example, as illustrated in FIG. 10A, the patch antenna 1110-2 may alternatively be disposed on an upper portion of the first ground layer 1122a.

The radiator 1110, namely, the monopole radiator may be configured as a first antenna that radiates a first signal (first beam B1) in a first direction parallel to the multi-layered substrate 1010. On the other hand, the patch antenna 1110-2 may be configured as a second antenna that radiates a second signal (second beam B2) in a second direction parallel to the multi-layered substrate 1010.

The radiator 1110, as illustrated in FIGS. 11A and 11B, may configure the array antenna 1100-1 by a plurality of radiators that are spaced apart from each other by a predetermined gap in a first horizontal direction of the multi-layered substrate 1010. Each of the plurality of radiators may further include the via wall structure 1130a, 1130 that is spaced apart from the radiator 1110 by a predetermined gap in a second horizontal direction. The via wall structures 1130a and 1130b may include a plurality of vertical vias vertically connected to one another between a plurality of pads at a plurality of points.

Figure 15A:
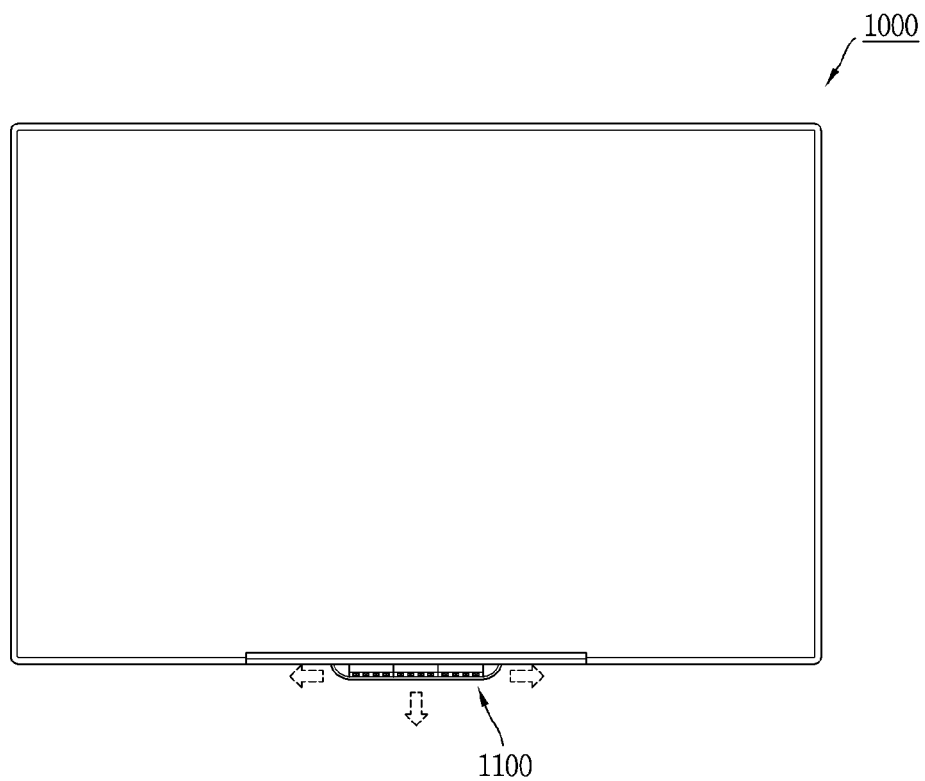
FIG. 15A illustrates a structure in which an antenna module 1100 having a first type antenna and a second type antenna as array antennas is disposed on an electronic device 1000.
Figure 15B:
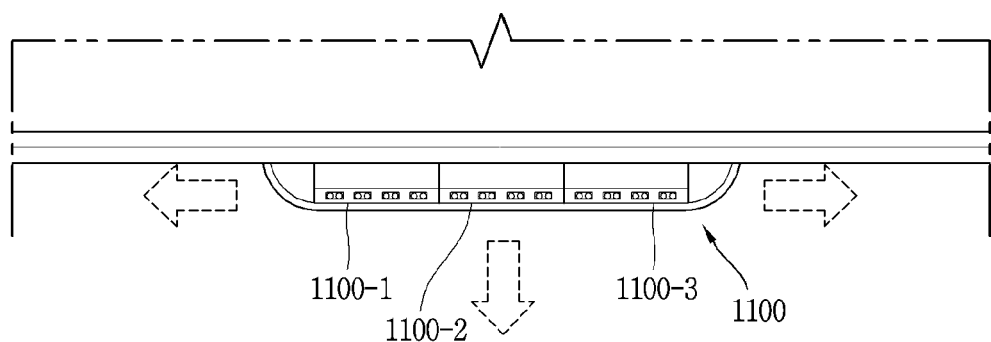
FIG. 15B is an enlarged view illustrating a plurality of array antenna modules.

As aforementioned, the path antenna 1110-2 as well as the monopole radiator 1100 may also be configured as the array antenna. In this regard, FIG. 15A illustrates a structure in which an antenna module 1100 having a first type antenna and a second type antenna as array antennas is disposed on an electronic device 1000. FIG. 15B is an enlarged view illustrating a plurality of array antenna modules.

Referring to FIGS. 1 to 15B, the array antenna may include a first array antenna module 1100-1, and a second array antenna module 1100-2 spaced apart by a predetermined gap from the first array antenna module 1100-1. Meanwhile, the number of array antennas is not limited to two, but may alternatively be three or more as illustrated in FIG. 15B. Therefore, the array antenna may include the first array antenna module 1100-1 to a third array antenna module 1100-3.

The processor 1400 may control the first and second array antenna modules 1100-1 and 1100-2 to form the first beam and the second beam in the first direction and the second direction, respectively. That is, the processor 1400 may control the first array antenna module 1100-1 to form the first beam horizontally in the first direction. Also, the processor 1400 may control the second array antenna module 1100-2 to form the second beam horizontally in the second direction. In this regard, the processor 1400 may perform MIMO using the first beam of the first direction and the second beam of the second direction.

The processor 1400 may form a third beam in a third direction using the first and second array antenna module 1100-1 and 1100-2. In this regard, the processor 1400 may control the transceiver circuit 1250 to synthesize signals received through the first and second array antenna modules 1100-1 and 1100-2. Also, the processor 1400 may control the transceiver circuit 1250 to distribute the signals transferred to the first and second array antenna modules 1100-1 and 1100-2 into each antenna element. The processor 1400 may perform beamforming using the third beam that has a beam width narrower than those of the first beam and the second beam.

Meanwhile, the processor 1400 may perform MIMO using the first beam of the first direction and the second beam of the second direction, and perform beamforming using a third beam having the narrower beam width than those of the first beam and the second beam. In relation, when a first signal and a second signal received from other electronic devices in the vicinity of the electronic device have qualities lower than or equal to a threshold value, the processor 1400 may perform beamforming using the third beam.

Figure 16:
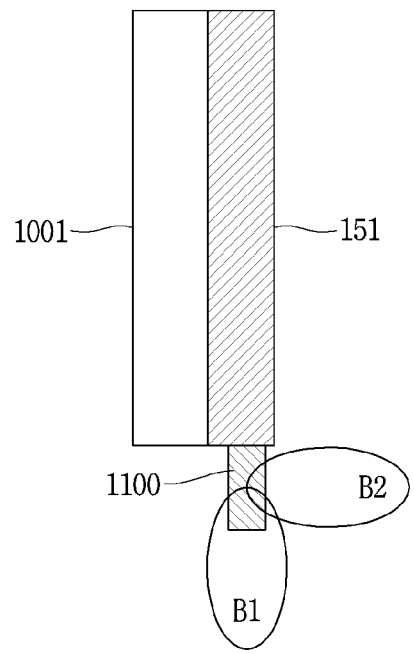
FIG. 16 illustrates antenna modules coupled in different coupling structures at specific positions of an electronic device according to embodiments.
Figure 16:
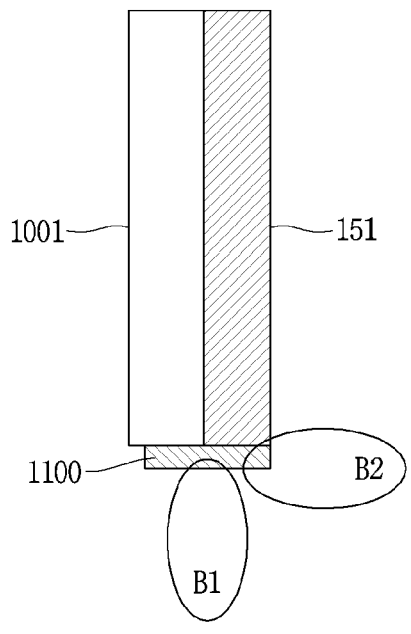
Figure 16:
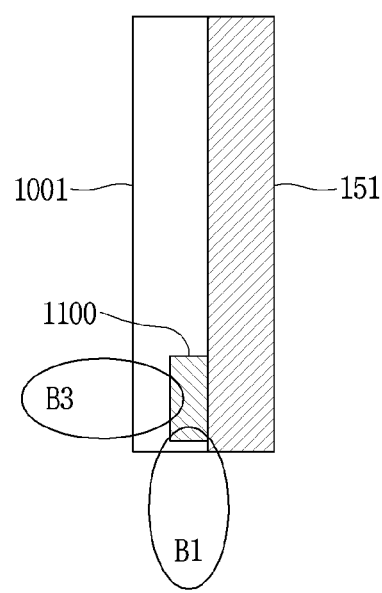

FIG. 16 illustrates antenna modules coupled in different coupling structures at specific positions of an electronic device according to embodiments. Referring to (a) of FIG. 16, the antenna module 1100 may be disposed substantially horizontal to the display 151 in a lower region of the display 151. Accordingly, a beam B1 can be generated in a downward direction of the electronic device through a monopole radiator. On the other hand, another beam B2 may be generated in a forward direction of the electronic device through a patch antenna.

Referring to (b) of FIG. 16, the antenna module 1100 may be disposed substantially vertical to the display 151 in the lower region of the display 151. Accordingly, a beam B2 may be generated in a forward direction of the electronic device through a monopole radiator. On the other hand, another beam B1 may be generated in a downward direction of the electronic device through a patch antenna.

Referring to (c) of FIG. 16, the antenna module 1100 may alternatively disposed inside a rear case 1001 corresponding to a mechanism structure. The antenna module 1100 may be disposed inside the rear case 1001 to be substantially parallel to the display 151. Accordingly, a beam B2 can be generated in a downward direction of the electronic device through a monopole radiator. On the other hand, another beam B3 may be generated in a rearward direction of the electronic device through a patch antenna.

The foregoing description has been given of the electronic device having the antenna module, in which the radiator of the LC tank monopole structure is disposed, in accordance with one aspect of the present disclosure. Hereinafter, a description will be given of an antenna module having a radiator of an LC tank monopole structure in accordance with another aspect of the present disclosure.

The antenna module 1100 disclosed herein may be an antenna element, for example, a monopole radiator 1110 that operates at a frequency band of 60 GHz, but the operating frequency band may vary depending on an application. As one example, an antenna that has vertical polarization at an mmWave band (e.g., 10 GHz to 300 GHz) may be implemented at an end of the multi-layered substrate 1010 corresponding to the PCB. The present disclosure aims at reducing a size of an antenna by lowering an operating frequency of the antenna having a predetermined height, in consideration of a height of a PCB which is thin. Also, the present disclosure aims at securing antenna broadband performance. For example, the antenna module 1100 may be configured to have a bandwidth (BW) of 13 GHz or more at 60 GHz. This is because a frequency band has a wide bandwidth of 57 to 70 GHz when employing IEEE 802.11ay.

An LC tank antenna having a stepped feed ground structure according to the present disclosure can achieve the aspect through the following solution. The antenna module 1100 of FIGS. 1 to 16 suggested in the present disclosure is an integral type. As one example, an antenna may be disposed on an end of a PCB using vias and via pads, which are used in a PCB process, such that the PCB as a multi-layered substrate and an antenna element are integrally formed with each other.

The antenna module 1100 according to the present disclosure may have a compact size. As one example, the LC tank structure may be formed by using two vias and via pads so as to lower the height of the monopole radiator 1110. In this regard, the first and second connection lines 1111a and 1111b corresponding to the vias and the first and second pads 1112a and 1112b corresponding to the via pads may be connected in line to form a via wall.

The antenna module 1100 according to the present disclosure may be a stepped feed ground. For example, the feed line 1121 connected to the monopole radiator 1110 may be formed to have a tapered width, to expand an operating frequency of the monopole radiator 1110. On the other hand, a ground of the feed line 1121 connected to the monopole radiator 1110 may be disposed to be stepped, to adjust impedance of the feed line 1121, thereby achieving impedance matching and improving an operating bandwidth.

In this regard, referring to FIGS. 1 to 16, the antenna module 1100 may include the radiator 1110 configured by stacking metal patterns on different layers of the multi-layered substrate 1010. The antenna module 1010 may include a feed part 1120 that is disposed on a specific layer of the radiator 1110 to be connected to the radiator 1110.

The radiator 1110 may include a first pad 1112a connected to the feed line 1121, and a second pad 1112b disposed on a top of the first pad 1112a. The first pad 1112a and the second pad 1112b may be connected to each other by a first connection line 1111a and a second connection line 1111b.

The first connection line 1111a may be configured to vertically connect a first end portion of the first pad 1112a and a first end portion of the second pad 1112b, thereby generating a first inductance component L1. The first connection line 1111b may be configured to vertically connect a second end portion of the first pad 1112a and a second end portion of the second pad 1112b, thereby generating a second inductance component L2. On the other hand, the first pad 112a having a first area and the second pad 1112b having a second area may be spaced apart from each other by a predetermined gap, thereby generating a capacitance component C. The radiator 1110 may be implemented to have a broadband characteristic by the first and second inductance components L1 and L2 and the capacitance component C.

In this regard, the first pad 1111a and the second pad 1112a may have different areas for a broadband impedance characteristic of the radiator 1110. Accordingly, the plurality of pads 1112a to 1112n disposed on the plurality of layers may be configured such that areas thereof are sequentially increased or decreased.

The feed part 1120 may include a feed line 1121, and a first ground layer 1122a that is disposed up to the first region R1 at a lower portion of the feed line 1121 in the horizontal direction. The feed part 1120 may include a second ground layer 1122b that is disposed up to the second region R2, which is more adjacent to the radiator 1110 than the first region, at from the lower portion of the first ground layer 1122a in the horizontal direction. The first width W1 of the feed line 1121 formed in the first region R1 and the second width W2 of the feed line 1121 formed in the second region R2 may be differently set.

The antenna module 1100 may further include a via wall structure 1130 spaced apart a predetermined distance from the radiator 1110 in the horizontal direction. The via wall structure 1130 may include a plurality of vertical vias vertically connected to one another between a plurality of pads 1112a to 1112n at a plurality of points. The via wall structure 1130 may be configured as a floating via wall 1130a, 1130b that is not electrically connected to the ground of the multi-layered substrate 1010.

Figure 17:
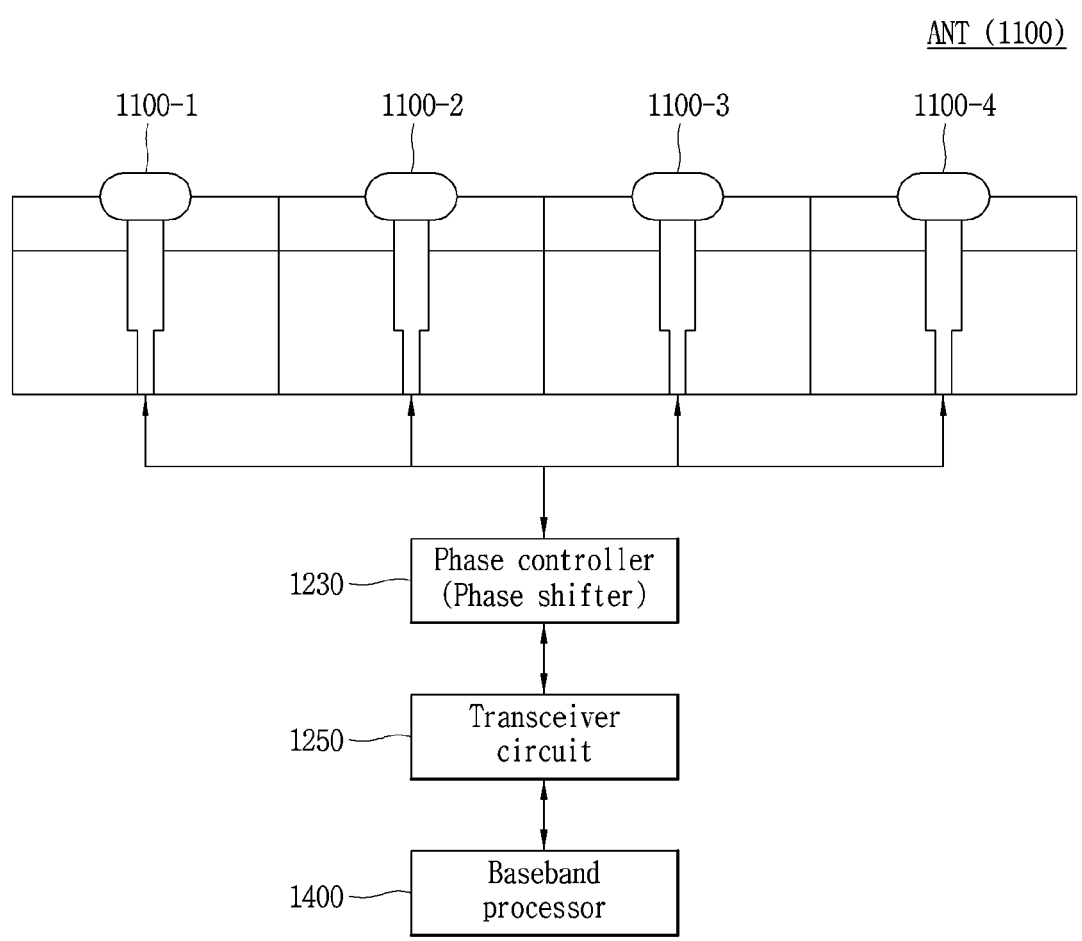
FIG. 17 illustrates an array antenna configured as a plurality of antenna elements having a structure of an LC tank monopole+tapered feed line, and an electronic device having the array antenna, in accordance with one embodiment.

The antenna element having the structure of LC tank monopole+tapered feed line may be configured as an array antenna having a plurality of antenna elements. In this regard, FIG. 17 illustrates an array antenna configured by a plurality of antenna elements having a structure of an LC tank monopole+tapered feed line, and an electronic device having the array antenna, in accordance with one embodiment. Referring to FIG. 17, the multi-layered substrate may correspond to the antenna module (ANT) 1100 that includes the radiator 1110 and the feed part 1120 having the tapered feed line 1121. The antenna module (ANT) 1100 may be configured as an array antenna having the plurality of antenna elements 1100-1 to 1100-4 that are spaced apart from one another by the predetermined distance. In this regard, the number of antenna elements may be four, but is not limited thereto and may vary depending on applications. The number of the plurality of antenna elements may be changed to 2, 4, 6, 8 or the like.

The antenna module (ANT) 1100 may further include a phase controller 1230 configured to control a phase of a signal applied to each of the plurality of antenna elements. In this regard, the electronic device may further include the transceiver circuit 1250 and the processor 1400. The multi-layered substrate may correspond to the antenna module (ANT) 1100. As one example, the transceiver circuit 1250 and the processor 1400 may be disposed on a separate circuit substrate from the antenna module (ANT) 1100. As another example, the transceiver circuit 1250 may be partially disposed on the multi-layered substrate corresponding to the antenna module (ANT) 1100.

The transceiver circuit 1250 may be operably coupled to the phase controller 1230. The transceiver circuit 1250 may be configured to control a signal to the array antenna through the phase controller 1230.

Figure 18:
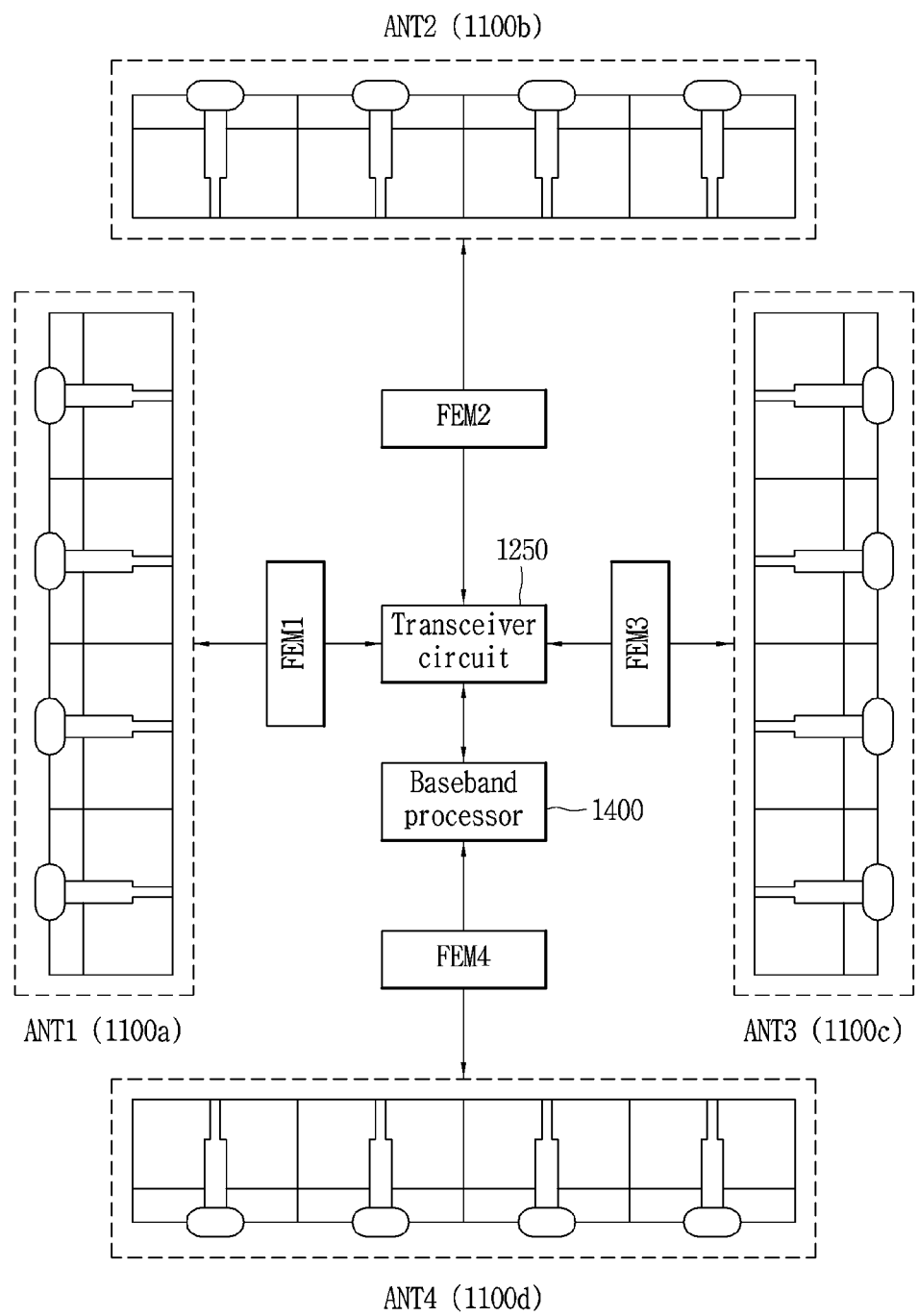
FIG. 18 illustrates a plurality of array antennas each configured as a plurality of antenna elements having a structure of an LC tank monopole+tapered feed line, and an electronic device having the array antennas, in accordance with one embodiment.

An array antenna having a plurality of antenna elements with the structure of LC tank monopole+tapered feed line disclosed herein may be configured as a plurality of array antennas disposed on different positions of the electronic device. In this regard, FIG. 18 illustrates a plurality of array antennas each configured by a plurality of antenna elements having a structure of an LC tank monopole+tapered feed line, and an electronic device having the array antennas, in accordance with one embodiment. Referring to FIGS. 17 and 18, the multi-layered substrate may correspond to the antenna module (ANT) 1100 that includes the radiator 1110 and the feed part 1120 having the tapered feed line 1121. The antenna module (ANT) 1100 may be configured by the plurality of array antennas ANT1 to ANT4 each including the plurality of antenna elements spaced apart from one another by the predetermined distance for performing beam-forming. As one example, the plurality of array antennas ANT1 to ANT4 may include a first array antenna (1100a) ANT1 to a fourth array antenna (1100d) ANT4, but are not limited thereto and may vary depending on applications.

In this regard, the antenna module (ANT) 1100 may include a plurality of antenna modules 1100a to 1100d disposed on different areas of the electronic device. In this regard, the electronic device may further include the transceiver circuit 1250 and the processor 1400. The multi-layered substrate may correspond to the antenna module (ANT) 1100. As one example, the transceiver circuit 1250 and the processor 1400 may be disposed on a separate circuit substrate from the antenna module (ANT) 1100. As another example, the transceiver circuit 1250 may be partially disposed on the multi-layered substrate corresponding to the antenna module (ANT) 1100.

The processor 1400 may be operably coupled to the transceiver circuit 1250 and may be configured to control the transceiver circuit 1250. The processor 1400 may control the transceiver circuit 1250 to perform MIMO while performing beamforming in different directions through the plurality of antenna modules 1100*a* to 1100*d*.

The first array antenna ANT1 to the fourth array antenna ANT4 may be operably coupled to a first front end module FEMI to a fourth front end module FEM4. In this regard, each of the first front end module FEMI to the fourth front end module FEM4 may include a phase controller, a power amplifier, and a reception amplifier. Each of the first front end module FEMI to the fourth front end module FEM4 may include several components of the transceiver circuit 1250.

The processor 1400 may be operably coupled to the first front end module FEMI to the fourth front end module FEM4. The processor 1400 may include several components of the transceiver circuit 1250 corresponding to the RFIC. The processor 1400 may include a baseband processor 1400 corresponding to a modem. The processor 1400 may be provided in a system on chip (SoC) form to include several components of the transceiver circuit 1250 corresponding to the RFIC and the baseband processor 1400 corresponding to the modem. However, the configuration of FIG. 12 is not limited thereto but may vary differently depending on applications.

The processor 1400 may control the first front end module FEMI to the fourth front end module FEM4 to radiate signals through at least one of the first array antenna ANT1 to the fourth array antenna ANT4. In this regard, an optimal antenna may be selected based on quality of a signal received through each of the first array antenna ANT1 to the fourth array antenna ANT4.

The processor 1400 may control the first front end module FEMI to the fourth front end module FEM4 to perform MIMO through two or more of the first array antenna ANT1 to the fourth array antenna ANT4. In this regard, an optimal antenna combination may be selected based on quality and interference level of a signal received through each of the first array antenna ANT1 to the fourth array antenna ANT4.

The processor 1400 may control the first front end module FEMI to the fourth front end module FEM4 to perform carrier aggregation (CA) through at least one of the first array antenna ANT1 to the fourth array antenna ANT4. In this regard, since each of the first array antenna ANT1 to the fourth array antenna ANT4 dual-resonates at the first band and the second band, the CA may be performed through one array antenna.

The processor 1400 may determine signal qualities at the first band and the second band with respect to each of the antennas. The processor 1400 may perform CA through one antenna at the first band and another antenna at the second band on the basis of signal qualities at the first band and the second band.

The antenna module corresponding to the multi-layered substrate may include various numbers of array antennas. In this regard, the electronic device may include two or more array antennas. The electronic device may include two array antennas and perform beamforming and MIMO using the two array antennas. As another example, the electronic device may include four or more array antennas and perform beamforming and MIMO using some of the four or more array antennas.

The antenna module corresponding to the multi-layered substrate may include the first array antenna (1100*a*) ANT1 and the second array antenna (1100*b*) ANT2. In this regard, the first array antenna (1100*a*) ANT1 and the second array antenna (1100*b*) ANT2 may operate as different polarized antennas. In this regard, FIG. 19 illustrates a plurality of array antennas configured as a plurality of antenna elements and an electronic device having the same in accordance with another embodiment.

Figure 19:
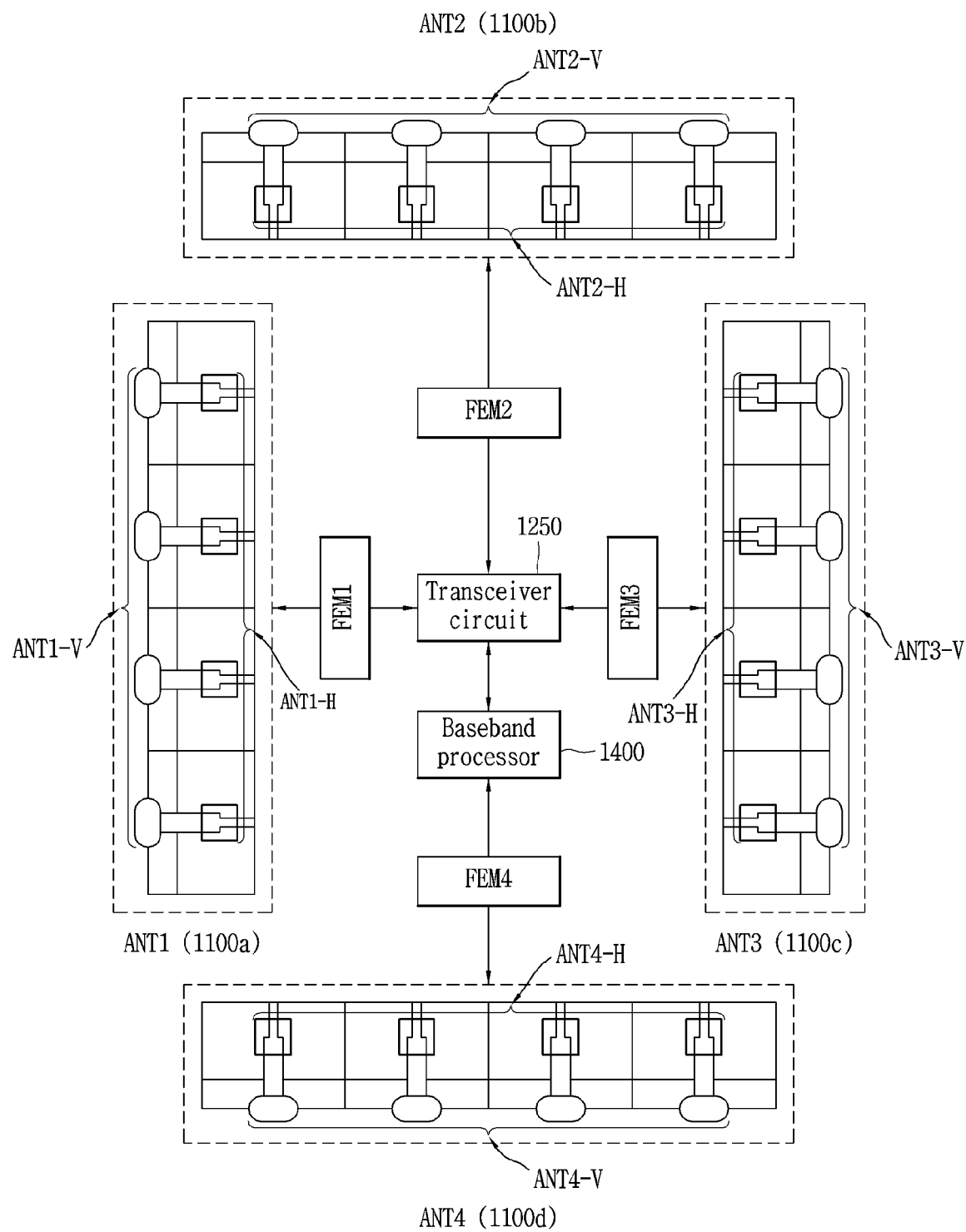
FIG. 19 illustrates a plurality of array antennas configured as a plurality of antenna elements and an electronic device having the same in accordance with another embodiment.

Referring to FIG. 19, the first array antenna (1100*a*) ANT1 may include a first horizontally polarized antenna ANT1-H and a first vertically polarized antenna ANT1-V. The second array antenna (1100*b*) ANT2 may include a second horizontally polarized antenna ANT2-H and a second vertically polarized antenna ANT2-V. On the other hand, the third array antenna (1100*c*) ANT3 may include a third horizontally polarized antenna ANT3-H and a third vertically polarized antenna ANT3-V. The fourth array antenna (1100*d*) ANT4 may include a fourth horizontally polarized antenna ANT4-H and a fourth vertically polarized antenna ANT4-V.

In this regard, the first to fourth horizontally polarized antennas ANT1-H to ANT4-H may be first type array antennas, like patch antennas, which radiate in an upward direction of the multi-layered substrate. On the other hand, the first to fourth horizontally polarized antennas ANT1-V to ANT4-V may be second type array antennas, like monopole antennas, which radiate in a lateral direction of the multi-layered substrate.

One antenna module may include therein different antennas having polarizations orthogonal to each other, so as to increase the number of MIMO streams by two times. The electronic device may perform maximum rank 8 MIMO through the first horizontally polarized antenna ANT1-H to the fourth horizontally polarized antenna ANT4-H and the first vertically polarized antenna ANT1-V to the fourth vertically polarized antenna ANT4-V. The electronic device may perform 8Tx UL-MIMO through the first horizontally polarized antenna ANT1-H to the fourth horizontally polarized antenna ANT4-H and the first vertically polarized antenna ANT1-V to the fourth vertically polarized antenna ANT4-V. The electronic device may perform 8Rx DL-MIMO through the first horizontally polarized antenna ANT1-H to the fourth horizontally polarized antenna ANT4-H and the first vertically polarized antenna ANT1-V to the fourth vertically polarized antenna ANT4-V.

Alternatively, one antenna module may include therein different antennas having polarizations orthogonal to each other, to suppress signal quality from being lowered due to rotation of the electronic device. In this regard, the first antenna ANT1 may simultaneously transmit and/or receive signals through the first horizontally polarized antenna ANT1-H and the first vertically polarized antenna ANT1-V. Accordingly, even if signal quality received through any one antenna is lowered due to the rotation of the electronic device, signal reception can be carried out through another antenna. Similarly, the fourth antenna ANT4 may simultaneously transmit and/or receive signals through the fourth horizontally polarized antenna ANT4-H and the fourth vertically polarized antenna ANT4-V. Accordingly, even if signal quality received through any one antenna is lowered due to the rotation of the electronic device, signal reception can be carried out through another antenna.

The processor 1400 may maintain dual connectivity state or perform a MIMO operation with different entities through the horizontally polarized antenna and the vertically polarized antenna. In this regard, the processor 1400 may control the transceiver circuit 1250 to maintain the dual connectivity state with a first entity and a second entity through the first array antenna (1100*a*) ANT1 and the fourth array antenna (1100*d*) ANT4. In this case, the first array antenna (1100*a*) ANT1 and the fourth array antenna (1100*d*) ANT4 may operate as the horizontally polarized antenna and the vertical polarized antenna, respectively. Therefore, the processor 1400 may perform dual connectivity or MIMO through antennas that are disposed at different positions in the antenna module of the electronic device to operate as polarized antennas orthogonal to each other. This can reduce interference between signals transmitted or received through different antennas during dual connectivity or MIMO.

As another example, the processor 1400 may control the transceiver circuit 1250 to maintain the dual connectivity state with a first entity and a second entity through the first array antenna (1100*b*) ANT2 and the fourth array antenna (1100*c*) ANT3, respectively. In this case, the second array antenna (1100*b*) ANT2 and the third array antenna (1100*c*) ANT3 may operate as the vertically polarized antenna and the horizontally polarized antenna, respectively. Therefore, the processor 1400 may perform dual connectivity or MIMO through antennas that are disposed at different positions in the antenna module of the electronic device to operate as polarized antennas orthogonal to each other. This can reduce interference between signals transmitted or received through different antennas during dual connectivity or MIMO.

It will be clearly understood by those skilled in the art that various changes and modifications to the aforementioned embodiments related to the array antenna operating at the mm Wave band and the electronic device controlling the same are made without departing from the idea and scope of the present disclosure. Therefore, it should be understood that such various modifications and alternations for the embodiments fall within the scope of the appended claims.

The electronic device disclosed herein can transmit or receive information simultaneously to or from various entities, such as an adjacent electronic device, an external device, a base station, or the like. Referring to FIGS. 1 to 19, the electronic device may perform MIMO through the antenna module 1100 and the transceiver circuit 1250 and the baseband processor 1400 that control the antenna module 1100. By performing the MIMO, communication capacity can be increased and/or reliability of information transmission and reception can be improved. Accordingly, the electronic device can transmit or receive different information to or from various entities at the same time to improve a communication capacity. This can improve the communication capacity of the electronic device through the MIMO without a bandwidth extension.

Alternatively, the electronic device may simultaneously receive the same information from various entities, so as to improve reliability for surrounding information and reduce latency. Accordingly, URLLC (Ultra Reliable Low Latency Communication) can be performed in the electronic device and the electronic device can operate as a URLLC UE. To this end, a base station performing scheduling may preferentially allocate a time slot for the electronic device operating as the URLLC UE. For this, some of specific time-frequency resources already allocated to other UEs may be punctured.

As described above, the plurality of array antennas ANT1 to ANT4 may perform wideband (broadband) operation at a first frequency band and a second frequency band. The baseband processor 1400 can perform MIMO through some of the plurality of array antennas ANT1 to ANT4 at the first frequency band. Also, the baseband processor 1400 can perform MIMO through some of the plurality of array antennas ANT1 to ANT4 at the second frequency band. In this regard, the baseband processor 1400 can perform MIMO by using array antennas that are sufficiently spaced apart from each other and disposed by being rotated at a predetermined angle. This can improve isolation between first and second signals within the same band.

One or more array antennas of the first antenna ANT1 to the fourth antenna ANT4 within the electronic device may operate as a radiator at the first frequency band. On the other hand, one or more array antennas of the first antenna ANT1 to the fourth antenna ANT4 may operate as a radiator at the second frequency band.

According to one embodiment, the baseband processor 1400 may perform MIMO through two or more array antennas of the first antenna ANT1 to the fourth antenna ANT4 at the first frequency band. On the other hand, the baseband processor 1400 may perform MIMO through two or more array antennas of the first antenna ANT1 to the fourth antenna ANT4 at the second frequency band.

In this regard, the baseband processor 1400 may transmit a time/frequency resource request of the second frequency band to the base station when signal qualities of two or more array antennas are all lower than or equal to a threshold value at the first frequency band. Accordingly, when a time/frequency resource of the second frequency band is allocated, the baseband processor 1400 may perform MIMO through two or more array antennas of the first antenna ANT1 to the fourth antenna ANT4 using the corresponding resource.

Even when a resource of the second frequency band is allocated, the baseband processor 1400 may perform MIMO using the same two or more array antennas. This can suppress power consumption caused by turning on/off the corresponding front end module FEM again due to the change of the array antenna. This can also suppress performance deterioration according to a settling time of an electronic component, for example, an amplifier, which is caused when the corresponding front end module FEM is turned on/off again in response to the change of the array antenna.

On the other hand, when a resource of the second frequency band is allocated, at least one of the two array antennas may change and the baseband processor 1400 may perform MIMO through the at least one array antenna. Therefore, different array antennas can be used when it is determined that it is difficult to perform communication through the corresponding array antenna due to difference in propagation environment between the first and second frequency bands.

According to another embodiment, the baseband processor 1400 may control the transceiver circuit 1250 to receive the second signal of the second frequency band while receiving the first signal of the first frequency band through one of the first to fourth antennas ANT1 to ANT4. In this case, there is an advantage that the baseband processor 1400 can perform carrier aggregation (CA) through one antenna.

Therefore, the baseband processor 1400 can perform CA through a band in which the first frequency band and the second frequency band are combined with each other. When it is necessary to transmit or receive a large amount of data in the electronic device, a broadband reception can be allowed through the CA.

Accordingly, eMBB (Enhanced Mobile Broad Band) communication can be performed in the electronic device and the electronic device can operate as an eMBB UE. To this end, the base station that performs scheduling may allocate a broadband frequency resource to the electronic device that operates as the eMBB UE. For this, the CA may be performed on frequency bands that are available, except for frequency resources already allocated to other UEs.

It will be clearly understood by those skilled in the art that various changes and modifications to the aforementioned embodiments related to the array antenna operating at the mm Wave band and the electronic device controlling the same are made without departing from the idea and scope of the present disclosure. Therefore, it should be understood that such various modifications and alternations for the embodiments fall within the scope of the appended claims.

So far, the antenna module operating in the millimeter wave (mmWave) band and the electronic device controlling the same have been described. Hereinafter, technical effects of the antenna module operating in the millimeter wave (mmWave) band and the electronic device controlling the same will be described.

According to an embodiment, an antenna module operating in a millimeter wave (mmWave) band and an electronic device controlling the same can be provided.

According to an embodiment, antenna elements operating in the mmWave band can be disposed inside a multi-layered substrate using a plurality of via structures between via pads, so as to provide an antenna module integral with an RF circuit.

According to an embodiment, an antenna module that is reduced in size by lowering heights of antenna elements vertically disposed inside a multi-layered substrate using a plurality of via structures between via pads can be provided.

According to an embodiment, an antenna module that is reduced in size by lowering heights of antenna elements vertically disposed inside a multi-layered substrate using a plurality of via structures disposed adjacent to the antenna elements in one direction.

According to an embodiment, a feed line connected to a monopole antenna can be tapered, so as to provide a broadband feed line structure that can improve an impedance matching characteristic of an antenna element, which is electrically connected to the feed line inside a multi-layered substrate.

According to an embodiment, a ground of feed line connected to a monopole antenna can be stepped, so as to provide a broadband feed line structure that can improve an impedance matching characteristic of an antenna element, which is electrically connected to the feed line inside a multi-layered substrate.

According to one embodiment, MIMO can be performed using only one antenna module through antennas having orthogonal polarizations.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art. In relation to the aforementioned disclosure, design and operations of an antenna operating in a mmWave band and an electronic device controlling the same can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller of the terminal.

Therefore, the detailed description should not be limitedly construed in all of the aspects, and should be understood to be illustrative. Therefore, all changes and modifications that fall within the metes and bounds of the claims, or equivalents of such metes and bounds are therefore intended to be embraced by the appended claims.

The invention claimed is:

1. An electronic device having antennas, the electronic device comprising:
   a radiator comprising a plurality of metal patterns stacked on different layers of a multi-layered substrate;
   an antenna module disposed on a specific layer of the radiator and including a feed part with a feed line connected to the radiator; and
   a processor operably connected to the antenna module and configured to control the antenna module to transmit or receive a wireless signal to or from a wireless device,
   wherein the radiator comprises:
   a first pad connected to the feed line; and
   a second pad disposed at an upper portion of the first pad,
   wherein a first connection line is configured to connect a first end portion of the first pad and a first end portion of the second pad to generate a first inductance component, and a second connection line is configured to connect a second end portion of the first pad and a second end portion of the second pad to generate a second inductance component,
   wherein the first pad and the second pad are spaced apart from each other by a predetermined gap to generate a capacitance component,
   wherein a broadband characteristic of the radiator is based on the first and second inductance components and the capacitance component,
   wherein the feed part comprises:
   the feed line;
   a first ground layer at a lower portion of the feed line and extending to a first region along a lateral direction; and
   a second ground layer at a lower portion of the first ground layer and extending to a second region along the lateral direction, wherein the second region is closer to the radiator than the first region, and
   wherein a first width of the feed line formed in the first region is different from a second width of the feed line formed in the second region.

2. The electronic device of claim 1, wherein the feed part is formed as a stepped ground in which a first height from the feed line to the first ground layer in the first region is higher than a second height from the feed line to the second ground layer in the second region.

3. The electronic device of claim 1, wherein the feed part further comprises an upper ground layer disposed at an upper portion of the feed line, and
   the feed line is configured as a strip line by the upper ground layer in the first region and the second region.

4. An antenna module comprising:
   a radiator comprising a plurality of metal patterns stacked on different layers of a multi-layered substrate; and
   a feed part disposed on a specific layer of the radiator and including a feed line connected to the radiator, and wherein the radiator comprises a first pad connected to the feed line and a second pad disposed at an upper portion of the first pad, wherein a first connection line is configured to connect a first end portion of the first pad and a first end portion of the second pad to generate a first inductance component, and a second connection line is configured to connect a second end portion of the first pad and a second end portion of the second pad to generate a second inductance component, wherein the first pad and the second pad are spaced apart from each other by a predetermined gap to generate a capacitance component, wherein a broadband characteristic of the radiator is based on the first and second inductance components and the capacitance component, wherein the feed part comprises:

the feed line;

a first ground layer at a lower portion of the feed line and extending to a first region along a lateral direction; and a second ground layer at a lower portion of the first ground layer and extending to a second region along the lateral direction, wherein the second region is closer to the radiator than the first region, and wherein a first width of the feed line formed in the first region is different from a second width of the feed line formed in the second region.

\* \* \* \* \*